US008048606B2

(12) United States Patent
Barr et al.

(10) Patent No.: US 8,048,606 B2
(45) Date of Patent: Nov. 1, 2011

(54) IMAGING METHODS

(75) Inventors: Robert K. Barr, Shrewsbury, MA (US); James T. Fahey, Mendon, MA (US); Corey O'Connor, Worcester, MA (US); James G. Shelnut, Northboro, MA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 1013 days.

(21) Appl. No.: 11/378,933

(22) Filed: Mar. 17, 2006

(65) Prior Publication Data

US 2006/0223009 A1 Oct. 5, 2006

Related U.S. Application Data

(63) Continuation of application No. 10/773,989, filed on Feb. 6, 2004.

(51) Int. Cl.
*G03C 1/00* (2006.01)
*G03F 7/00* (2006.01)
*G03C 5/00* (2006.01)
*G03C 5/22* (2006.01)

(52) U.S. Cl. ..................... 430/270.1; 430/322; 430/340; 430/356; 430/367; 430/338

(58) Field of Classification Search ............... 430/270.1, 430/926, 311
See application file for complete search history.

(56) References Cited

U.S. PATENT DOCUMENTS 3,390,994 A 7/1968 Cescon
3,390,997 A 7/1968 Read
3,445,234 A 5/1969 Cescon et al.
3,598,592 A 8/1971 Cescon
3,630,736 A 12/1971 Cescon et al.
3,652,275 A 3/1972 Baum et al.
3,658,543 A 4/1972 Gerlach, Jr. et al.
3,666,466 A 5/1972 Strilko
3,726,804 A 4/1973 Matsukawa et al.
3,761,942 A 9/1973 Lorenz et al.
3,796,696 A 3/1974 Brown
3,909,328 A * 9/1975 Dessauer et al. .............. 156/219
3,968,123 A 7/1976 Dingwall et al.
3,977,953 A 8/1976 Von Hirsch et al.
3,993,489 A 11/1976 Heimsch et al.
4,017,313 A 4/1977 Hartzler
4,065,315 A 12/1977 Yamazaki et al.
4,090,877 A 5/1978 Streeper
(Continued)

FOREIGN PATENT DOCUMENTS

GB 544 983 5/1942
(Continued)

OTHER PUBLICATIONS

Grant & Hackh's Chemical Dictionary; Fifth Edition; 1987; pp. 306 and 469.

(Continued)

*Primary Examiner* — Cynthia Kelly
*Assistant Examiner* — Connie P Johnson
(74) *Attorney, Agent, or Firm* — John J. Piskorski

(57) ABSTRACT

An imaging method is disclosed. An imaging composition is coated on a work piece followed by applying a sufficient amount of energy from a 3-D imaging system to form an image on the coated work piece. The image may be a logo or marker for alignment of parts.

9 Claims, 3 Drawing Sheets

U.S. PATENT DOCUMENTS 4,147,552 A 4/1979 Specht et al.
4,155,892 A 5/1979 Emmons et al.
4,162,162 A 7/1979 Dueber
4,212,937 A 7/1980 Akashi et al.
4,239,379 A * 12/1980 Tomita et al. .................. 355/52
4,280,888 A 7/1981 Bush et al.
4,311,783 A 1/1982 Dessauer
4,320,140 A 3/1982 Crounse et al.
4,341,860 A 7/1982 Sysak
4,343,885 A 8/1982 Reardon, Jr.
4,535,052 A 8/1985 Anderson et al.
4,565,769 A 1/1986 Dueber et al.
4,575,625 A 3/1986 Knowles
4,619,956 A 10/1986 Susi
4,647,578 A 3/1987 Crounse et al.
4,720,449 A 1/1988 Borror et al.
4,861,620 A 8/1989 Azuma et al.
4,874,799 A 10/1989 Hung et al.
4,882,265 A 11/1989 Laganis et al.
4,894,314 A 1/1990 Barr et al.
4,917,977 A 4/1990 Smothers
4,962,009 A 10/1990 Washizu et al.
4,987,230 A 1/1991 Monroe
5,008,231 A 4/1991 Yoshizawa et al.
5,019,549 A 5/1991 Kellogg et al.
5,102,952 A 4/1992 Memon
5,112,721 A 5/1992 Kuchta
5,137,571 A 8/1992 Eisenhart et al.
5,139,928 A 8/1992 Lewis et al.
5,147,758 A 9/1992 Smothers et al.
5,149,617 A 9/1992 Liu et al.
5,153,106 A 10/1992 Liu et al.
5,204,467 A 4/1993 Smothers
5,219,917 A 6/1993 Ingle et al.
5,225,312 A 7/1993 Dixit et al.
5,236,808 A 8/1993 Smothers
5,244,769 A 9/1993 Yanagihara et al.
5,256,520 A 10/1993 Smothers
5,302,429 A 4/1994 Memon
5,320,933 A 6/1994 Lundy et al.
5,332,819 A 7/1994 Smothers
5,369,140 A 11/1994 Valet et al.
5,389,489 A 2/1995 Yanagihara et al.
5,395,718 A 3/1995 Jensen et al.
5,397,686 A 3/1995 Dominick et al.
5,401,608 A 3/1995 Pawlowski et al.
5,413,629 A 5/1995 Yasui et al.
5,414,041 A 5/1995 Larson et al.
5,444,505 A 8/1995 Dorsey-Palmateer
5,484,927 A 1/1996 Smothers
5,552,249 A 9/1996 Jensen et al.
5,651,600 A 7/1997 Dorsey-Palmateer
5,665,522 A 9/1997 Vogel et al.
5,681,676 A * 10/1997 Telfer et al. ..................... 430/22
5,705,298 A 1/1998 Knoedl, Jr.
5,705,560 A 1/1998 Takarabe et al.
5,723,653 A 3/1998 Santhanam
5,742,385 A 4/1998 Champa
5,744,280 A 4/1998 Mooney, III et al.
5,786,132 A 7/1998 Nohr et al.
5,821,497 A 10/1998 Yamazaki et al.
5,831,661 A 11/1998 Tabuchi et al.
5,837,429 A 11/1998 Nohr et al.
5,846,682 A 12/1998 Murofushi et al.
5,858,583 A 1/1999 Dessauer et al.
5,942,370 A * 8/1999 Neckers ........................ 430/269
5,942,554 A 8/1999 Ren et al.
5,955,224 A 9/1999 Caspar et al.
6,120,946 A 9/2000 Johnson et al.
6,124,044 A 9/2000 Swidler
6,187,432 B1 2/2001 Krish et al.
6,242,149 B1 6/2001 Maeda
6,251,571 B1 6/2001 Dessauer et al.
6,309,797 B1 10/2001 Grinevich et al.
6,322,950 B1 11/2001 Sorori et al.
6,331,286 B1 12/2001 Dees et al.
6,384,169 B1 * 5/2002 Watanabe et al. ............. 526/346
6,411,362 B2 6/2002 Anderson et al.
6,433,035 B1 8/2002 Grinevich et al.
6,433,069 B1 8/2002 Oeltjen et al.
6,482,879 B2 11/2002 Hieltjes et al.
6,492,019 B1 12/2002 Shipston et al.
6,503,621 B1 1/2003 Ma et al.
6,527,900 B1 3/2003 Kreckel et al.
6,528,555 B1 3/2003 Nikutowski et al.
6,541,109 B1 4/2003 Kumar et al.
6,545,084 B2 4/2003 Brown et al.
6,547,397 B1 * 4/2003 Kaufman et al. ............... 353/28
6,555,615 B2 4/2003 Van Rheenen
6,613,381 B1 9/2003 Bredahl et al.
6,627,309 B2 9/2003 Stebbings et al.
6,632,522 B1 10/2003 Hyde et al.
6,653,265 B2 11/2003 Rossi et al.
6,660,374 B2 12/2003 Smetana et al.
6,754,551 B1 6/2004 Zohar et al.
6,828,525 B1 12/2004 Hayes et al.
6,935,748 B2 8/2005 Kaufman et al.
2002/0064728 A1 * 5/2002 Weed et al. ................ 430/281.1
2003/0108708 A1 6/2003 Anderson et al.
2003/0149164 A1 8/2003 Minnee et al.
2005/0058332 A1 3/2005 Kaufman et al.
2005/0175929 A1 8/2005 Barr et al.
2005/0175931 A1 8/2005 O'Connor et al.
2005/0175941 A1 8/2005 Shelnut et al.

FOREIGN PATENT DOCUMENTS

JP 11-109555 4/1999

OTHER PUBLICATIONS

Enthone Imaging Technologies Update; Photoimageable Legend Inks: Selection Criteria; Jun. 2002/ No. 12.

Basic Printed Circuit Board Manufacture; Electronics Industry Training/Workshop 23; May 2002; pp. 1-13.

Technical Data Sheet Scribe ELP112; Aqueous Developable Liquid Photoimageabie Legend Paste; Web site: www.electrapolymers.com, pp. 1-5 (date not available).

MEGA Electronics; Screen Printing Instructions; Mega Electronics Ltd, England; Web site: http://www.megaelect.demon.co.uk/; pp. 1-6 (date not available).

* cited by examiner

IMAGING METHODS

The present application is a continuation application of co-pending patent application Ser. No. 10/773,989 filed Feb. 6, 2004.

BACKGROUND OF THE INVENTION

The present invention is directed to imaging methods using three-dimensional imaging systems and imaging compositions. More specifically, the present invention is directed to imaging methods using three-dimensional imaging systems and imaging compositions such that the imaging compositions form an image upon application of a sufficient amount of energy from the three-dimensional imaging systems.

There are numerous compositions and methods employed in various industries to form images on substrates to mark the substrates. Such industries include the paper industry, packaging industry, paint industry, medical industry, dental industry, electronics industry, textile industry, aeronautical, marine and automotive industries, and the visual arts, to name a few. Imaging or marking typically is used to identify an article such as the name or logo of a manufacturer, a serial number or lot number, tissue types, or may be used for alignment purposes in the manufacture of semiconductor wafers, aeronautical ships, marine vessels and terrestrial vehicles.

Marking also is employed in proofing products, photoresists, soldermasks, printing plates and other photopolymer products. For example, U.S. Pat. No. 5,744,280 discloses photoimageable compositions allegedly capable of forming monochrome and multichrome images, which have contrast image properties. The photoimageable compositions include photooxidants, photosensitizers, photodeactivation compounds and deuterated leuco compounds. The leuco compounds are aminotriarylmethine compounds or related compounds in which the methane (central) carbon atom is deuterated to the extant of at least 60% with deuterium incorporation in place of the corresponding hydrido aminotriarylmethine. The patent alleges that the deuterated leuco compounds provide for an increased contrast imaging as opposed to corresponding hydrido leuco compounds. Upon exposure of the photoimageable compositions to actinic radiation a phototropic response is elicited.

Marking of information on labels, placing logos on textiles, or stamping information such as company name, a part or serial number or other information such as a lot number or die location on semiconductor devices may be affected by direct printing. The printing may be carried out by pad printing or screen printing. Pad printing has an advantage in printing on a curved surface because of the elasticity of the pad but is disadvantageous in making a fine pattern with precision. Screen printing also meets with difficulty in obtaining a fine pattern with precision due to the limited mesh size of the screen. Besides the poor precision, since printing involves making a plate for every desired pattern or requires time for setting printing conditions, these methods are by no means suitable for uses demanding real time processing.

Hence, marking by printing has recently been replaced by ink jet marking. Although ink jet marking satisfies the demand for speed and real time processing, which are not possessed by many conventional printing systems, the ink to be used, which is jetted from nozzles under pressure, is strictly specified. Unless the specification is strictly met, the ink sometimes causes obstruction of nozzles, resulting in an increase of reject rate.

In order to overcome the problem, laser marking has lately been attracting attention as a high-speed and efficient marking method and already put to practical use in some industries. Many laser marking techniques involve irradiating only necessary areas of substrates with laser light to denature or remove the irradiated area or irradiating a coated substrate with laser light to remove the irradiated coating layer thereby making a contrast between the irradiated area (marked area) and the non-irradiated area (background).

Using a laser to mark an article such as a semiconductor chip is a fast and economical means of marking. There are, however, certain disadvantages associated with state-of-the art laser marking techniques that burn the surface to achieve a desired mark. For example, a mark burned in a surface by a laser may only be visible at select angles of incidence to a light source. Further, oils or other contaminants deposited on the article surface subsequent to marking may blur or even obscure the laser mark. Additionally, because the laser actually burns the surface of the work piece, for bare die marking, the associated burning may damage any underlying structures or internal circuitry or by increasing internal die temperature beyond acceptable limits. Moreover, where the manufactured part is not produced of a laser reactive material, a laser reactive coating applied to the surface of a component adds expense and may take hours to cure.

Alternatively, laser projectors may be used to project images onto surfaces. They are used to assist in the positioning of work pieces on work surfaces. Some systems have been designed to project three-dimensional images onto contoured surfaces rather than flat surfaces. The projected images are used as patterns for manufacturing products and to scan an image of the desired location of a ply on previously placed plies. Examples of such uses are in the manufacturing of leather products, roof trusses, and airplane fuselages. Laser projectors are also used for locating templates or paint masks during the painting of aircraft.

The use of scanned laser images to provide an indication of where to place or align work piece parts, for drilling holes, for forming an outline for painting a logo or picture, or aligning segments of a marine vessel for gluing requires extreme accuracy in calibrating the position of the laser projector relative to the work surface. Typically six reference points are required for sufficient accuracy to align work piece parts. Reflectors or sensors typically have been placed in an approximate area where the ply is to be placed. Since the points are at fixed locations relative to the work and the laser, the laser also knows where it is relative to the work. The requirement of six fixed reference points has been somewhat restricting in systems such as are used for airplane fuselages. The plies and jobs utilized to attach the plies onto the airplane fuselage are large. The reference points must be placed at locations where the plies do not cover the reference points. The use of the fixed points has been difficult to achieve. Furthermore, workers must travel to the workplace and accurately place the fixed reference points. However, workers can come between the laser output and the work piece upon which the laser image is displayed thereby blocking the alignment beam. Although the workers may mark the place where the laser beam image contacts the work piece with a marker or masking tape to define the laser image, such methods are tedious, and may still block the beam as the workers' hands move in front of the beam to make the markings. Accordingly, misalignment may occur, thus there is a need for an improved method of marking a substrate.

Another problem associated with laser marking is the potential for opthalmological damage to the workers. Many lasers used in marking may cause retinal damage to workers involved in the marking system. Generally, lasers which intensities exceeding 5 mW present hazards to workers.

Accordingly, there is a need for improved methods of marking a work piece.

SUMMARY OF THE INVENTION

Methods include applying imaging compositions to work pieces and applying three-dimensional images on the imaging compositions with a three-dimensional imaging system to form images on the imaging compositions, the imaging compositions include one or more sensitizes. The three-dimensional imaging systems utilize three-dimensional data sets to project images onto the imaging compositions. Energy from the projected images induces color or shade changes in the imaging compositions to form images. Algorithms are used to position the projected images onto the imaging compositions.

In another embodiment the methods include applying imaging compositions to work pieces and selectively applying three-dimensional images on the imaging compositions with a three-dimensional imaging system to form images on the imaging compositions by inducing a color or shade change, the imaging compositions include one or more sensitizers.

In further embodiments the imaging compositions include one or more sensitizers, reducing agents, oxidizing agents, color formers, polymers, diluents, plasticizers, flow agents, chain transfer agents, adhesion promoters, adhesives, organic acids, surfactants, thickeners, rheological modifiers and other optional components to tailor the imaging compositions for desired imaging methods and work pieces.

In another embodiment the methods include applying imaging compositions having one or more sensitizers to film substrates to form articles, applying the articles to work pieces, selectively applying three-dimensional images on the imaging compositions of the articles with three-dimensional imaging systems to form images on the imaging compositions of the articles by inducing a color or shade change. The articles include adhesives to secure them to work pieces.

The methods provide a prompt and efficient means of forming images on work pieces such as aeronautical ships, marine vessels, and terrestrial vehicles. Three-dimensional data sets may be projected onto contoured or non-contoured surfaces with the imaging compositions to form images on work pieces. Portions of the imaging compositions may be removed with suitable developers or strippers before or after further processing is done on the work piece. When the imaging compositions contain a releasable adhesive or are on articles with releasable adhesives, unwanted portions may be peeled from the work pieces.

The methods may be used as a mark or indicator, for example, to drill holes for fasteners to join parts together, to form an outline for making a logo or picture on an airplane, or to align segments of marine vessel parts. The methods also may be used to identify surface defects such as dents or scratches. Since the compositions may be promptly applied to the work piece and the image promptly formed by application of energy to create images, workers no longer need to work adjacent the substrate to mark laser beam images with a hand-held marker or tape in the fabrication of products. Accordingly, the problems of blocking light caused by the movement of workers hands and the slower and tedious process of applying marks by workers using a hand-held marker or pieces of tape are eliminated.

Additionally, the methods may cause color or shade change in the imaging compositions using low levels of powers such as 5 mW or less. Such low levels of powers eliminate or at least reduce the potential of opthalmological damage to workers.

Further, the reduction of human error increases the accuracy of imaging. This is important when the images are used to direct the alignment of parts such as in aeronautical ships, marine vessels or terrestrial vehicles where accuracy in fabrication is critical to the reliable and safe operation of the machines. Accordingly, the methods provide for improved manufacturing over many conventional alignment and imaging processes.

BRIEF DESCRIPTION OF THE DRAWINGS

The file of this patent contains at least one drawing executed in color. Copies of this patent with color drawing(s) will be provided by the Patent Office upon request and payment of the necessary fee.

DETAILED DESCRIPTION OF THE INVENTION

Figure 1:
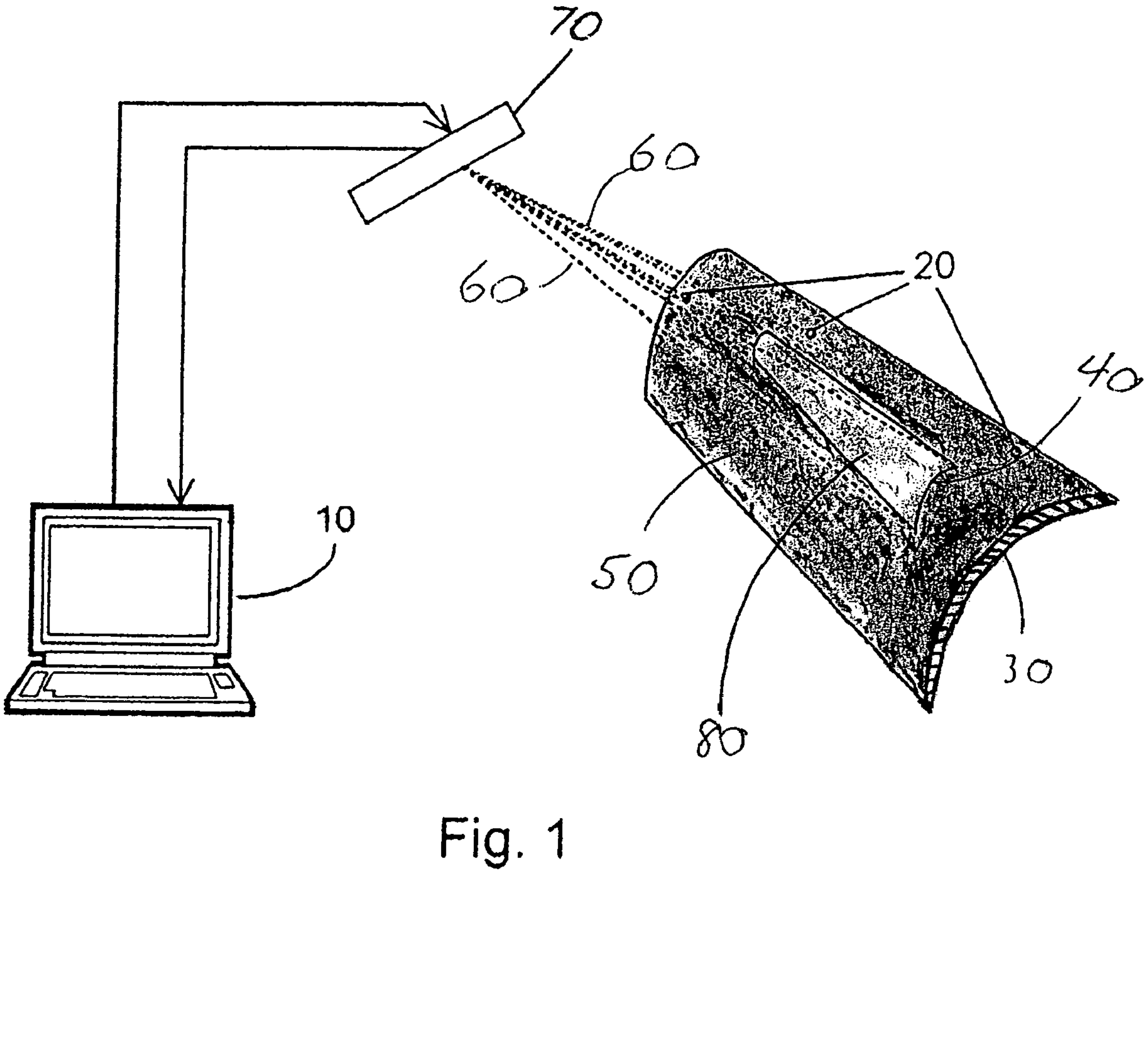
FIG. 1 is a perspective view of a laser projector projecting an image onto a work piece coated with an imaging composition.

As used throughout this specification, the following abbreviations have the following meaning, unless the context indicates otherwise: ° C.=degrees Centigarde; IR=infrared; UV=ultraviolet; gm=gram; mg=milligram; L=liter; mL=milliliter; wt %=weight percent; erg=1 dyne cm=$10^{-7}$ joules; J=joule; mJ=millijoule; nm=nanometer=$10^{-9}$ meters; cm=centimeters; mm=millimeters; W=watt=1 joule/second; and mW=milliwatt; ns=nanosecond; μsec=microsecond; Hz=hertz; kHz=kilohertz; MHz=megahertz; kV=kilovolt; 3-D=three-dimensional.

The terms "polymer" and "copolymer" are used interchangeably throughout this specification. "Actinic radiation" means radiation from light that produces a chemical change. "Photofugitive response" means that the application of energy causes a colored material to fade, or become lighter. "Phototropic response" means that the application of energy causes material to darken. "Changing shade" means that the color fades or becomes darker. "Algorithm" is a procedure for solving a mathematical problem in a finite number of steps that frequently involves repetition of an operation. "(Meth)acrylate" includes both methacrylate and acrylate, and "(meth)acrylic acid" includes both methacrylic acid and acrylic acid. "Diluent" means a carrier or vehicle, such as solvents or solid fillers. "Room temperature" means 18° C. to 23° C.

Unless otherwise noted, all percentages are by weight and are based on dry weight or solvent free weight. All numerical ranges are inclusive and combinable in any order, except where it is logical that such numerical ranges are constrained to add up to 100%.

The methods include applying imaging compositions including one or more sensitizers to work pieces and applying three-dimensional images on the imaging compositions with three-dimensional imaging systems to form images on the imaging compositions by inducing a color or shade change. The images formed on the compositions, for example, may be patterns such as logos, letters, numbers, marks for alignment purposes in the manufacture of products, or marks to indicate defects in a work piece surface. Once the image is formed on the imaging composition coated on a work piece, unwanted portions may be removed leaving the desired image on the work piece. The work piece may be further processed to complete the fabrication of the end product. For example, if a logo is desired on the work piece, the work piece is coated with the imaging composition. The 3-D imaging system selectively projects the desired 3-D image or logo onto the imaging composition with the aid of an appropriate computer program. The projected 3-D image, typically in the form of laser light, provides sufficient energy to induce a color or shade change in the selected portions of the imaging composition. After the desired image is formed the non-selected portions may be removed with a suitable developer, stripper, or the non-selected portions may be peeled off of the work piece.

The methods also may be used to selectively place marks or points on the imaging compositions for alignment purposes. For example, a 3-D imaging system may selectively project laser beams on an imaging composition to create points or marks having a color contrast with respect to the remainder of the composition. Holes may be drilled through the colored points for placing fasteners to join the work piece to another part such as in the manufacture of an airplane, boat or automobile.

Any suitable 3-D imaging system may be used. One example of a suitable 3-D system is one where the distance from 3-D reference sensors and the surface of a work piece are estimated or manually determined. Such 3-D imaging systems use at least four reference sensors and typically six references sensors for application. Another type of 3-D imaging system is one where the distance from 3-D imaging systems and the surface of the work piece is accurately determined. In such 3-D imaging systems one reference sensor may be sufficient for application. Typically, three reference sensors are used. Reference sensors are placed on the work piece for proper positioning of the projected image. Such systems are suitable for image formation on contoured surfaces, thus providing a more accurate image on a work piece than many conventional imaging methods.

In 3-D imaging systems where the distance from the imaging system to the reference sensors is accurately determined, the 3-D imaging system combines a laser projector and a laser range finder into one system head for determining the distance between the laser projector and a work surface. Such systems also include a laser light emitting component, a motorized focusing assembly for focusing the beam of the laser light at some distance from the 3-D imaging system, a two-axis beam steering mechanism to rapidly direct the laser light over a defined surface area, a photo optic feedback component, a timing device, a controller module, a data storage device, an input power module, one or more output DC power modules, and an imaging system cooling subsystem. The laser light emitting component typically produces a visible laser light and may include a prism to optically correct astigmatism as well as one or more lenses that work as a beam collimator. The motorized focusing assembly, which receives the laser beam, has a focusing lens mounted to a linear actuator. The linear actuator is mechanically attached to a DC motor, which is controlled by a motor controller. The focusing assembly also includes travel limit sensors that are mounted at the ends of the travel of the focus assembly. The travel limit sensors as well as the motor controller are connected to the controller module.

The controller module is the brain of the image system. It contains a microprocessor that controls the operation of the imaging system in response to various parameter inputs to properly project a 3-D image onto a work piece. Typically, the controller module is a single-board computer that processes specific software commands. An example of a suitable single-board computer is available from WinSystems, Arlington, Tex., U.S.A. (Cat. No. LBC-586Plus).

3-D imaging systems where the distance between the laser projector and the work piece is accurately known determine the distance between the projector and the work piece using its internal range finding system. The 3-D reference sensors' x-y-z positions are calculated. A computer algorithm uses the calculated x-y-z positions of the 3-D reference sensors to calculate the position of the projection. Because the distance between the projector and the sensors can be accurately determined, only three reference sensors may be used to project an image onto a work piece. An example of such a 3-D imaging system is disclosed in U.S. Pat. No. 6,547,397, the entire disclosure of which is hereby incorporated herein in its entirety by reference.

FIG. 1 shows one embodiment where operator interface 10, projector 70 having the data set defining the 3-D image 40 projected on the imaging composition 50 with laser beams 60 and reference sensors 20 positioned on the work piece 30. An integrated laser range-finding system accurately determines the x-y-z positions of the reference sensors 20. The laser beams 60 induce a photofugitive response throughout region 80 of the imaging composition 50 to create a shade contrast with respect to the remainder of the imaging composition 50.

Figure 2:
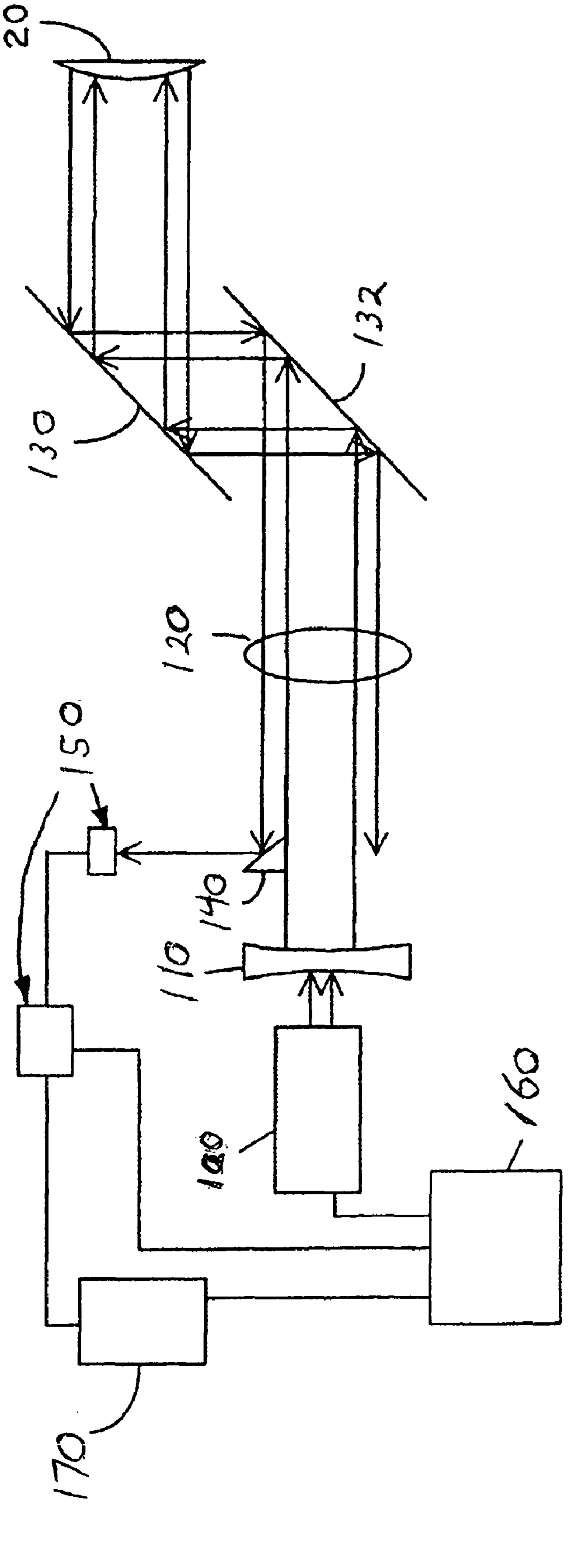
FIG. 2 is a schematic of a range-finding system for a three-dimensional imaging system.

FIG. 2 is a schematic of a range-finding system of a 3D imaging system, which determines the distance between the projector 70 and the position of the reference sensors 20. In one embodiment the laser beam from laser emitting component 100 is passed through a −12.5 mm focal length collimating lens 110 to produce an 8 mm diameter laser beam. The laser beam passes through focus lens 120 having a 100 mm focal length and redirected by reflective optical elements 130 and 132 to retro-reflective surface of reference sensor 20. Focus lens 120 has an adjustment range of ±5 cm. The return beam has a diameter of greater than 8 mm and retraces the same path back through focus lens 120 and collimating lens 110, adjustable reflective element 140 is placed into the return beam to the edge of the 8 mm initial beam. The return beam is directed to photo optic sensor 150 where the optical signal is converted to a digital signal and analyzed by the controller module 160.

To accurately measure the distance between the projector 70 and a reference sensor 20, the range-finding system performs a coarse focus followed by a fine focus of the laser beam onto reference sensor 20. The initial coarse focus may be done manually or automatically. To begin distance measuring, a continuous wave laser light from light emitting component 100 is placed on or near a reference 20. The imaging system software causes projector 70 to scan an area in the vicinity where the reference sensor 20 is located. A return signal is received as the laser beam crosses reference sensor 20. The midpoint of the return signal is chosen as the center from which a fine focus is next performed. To perform the fine focus the laser beam is switched from a continuous wave light to a pulsating wave light. The pulsing rate is provided in a range of $2^{n+5}$ where n is 0 to 15. For example, the pulsating rate may provide a pulsing range of $2^{10}$ to $2^{20}$ or a frequency range of 1.024 kHz to 1.048576 MHz. The pulsing rate is stepped by a power of 10, e.g. $2^{10}, 2^{11}, 2^{12}, \ldots, 2^{20}$. The data is compared to an empirical lookup table to pick the best frequency for the range. The empirical lookup table contains data relating to laser beam diameters, pulse rate and distances. Once the best frequency is chosen, then the clock counter is set in timing device 170.

Projector 70 is operated by software having two major components, an administrator program and an operator program. The operator program may be configured as a master, a slave or a master/slave. The administrator program provides for the administration of the various databases used in operating the 3-D projection system. It also defines the accessibility levels for various operators regarding the various databases. The administrator program may reside on a data storage device, a server, a personal computer, or a workstation connected to projector 70. The operator program allows an operator to use the 3-D projection system to project images onto work pieces. The operator program may also reside on a data storage device, a server, a personal computer, or a workstation.

In many 3-D imaging systems the computation for 3-D projections involves basic algorithms for computing the relationship between the galvanometers of the projectors. The algorithms involve a distance factor "d" that is the distance from the galvanometer to the surface of the work piece being projected upon. However, this distance factor is assumed or is removed from the equations. Using only three reference points may give rise to divergence in the solutions to such algorithms. A consequence of this potential divergence six reference points are typically used to perform a least squares analysis in order to obtain the desired accuracy to project the 3-D image and to insure that the solution converges. In 3-D imaging systems where a range-finding system is used the "d" factor, i.e. the distance to at least one reference point on the reference target, is measured. Typically, the distance to three reference points are measured to increase the accuracy of the positioning of the projected image. In such 3-D imaging system is the algorithms converge.

Basic algorithms used to project a 3-D laser image onto a work piece involve a system of equations relating the World (Tool) Frame and the projector frame. Such a system of equations is referred to as a coordinate system transform. Below are the linear equations that correspond to the transform from the World (Tool) Frame to the projector frame:

$$\left\{\begin{array}{l} s = x_P = m_{11}\cdot(x-PX) + m_{12}\cdot(y-PY) + m_{13}\cdot(z-PZ) \\ u = y_P = m_{21}\cdot(x-PX) + m_{22}\cdot(y-PY) + m_{23}\cdot(z-PZ) \\ t = z_P = m_{31}\cdot(x-PX) + m_{32}\cdot(y-PY) + m_{33}\cdot(z-PZ) \end{array}\right\} \quad \text{Eq. 1}$$

Where:

x, y, z are coordinates of any given point (A) in the World Frame.

PX, PY, PZ are coordinates of the projector origin in the World Frame.

$x_P$, $y_P$, $z_P$, are coordinates of any given point (A) in the Projector Frame.

$m_{ij}$ are coefficients of Rotation Matrix (see below).

s, u, t are assigned instead of $x_P$, $y_P$, $z_P$, for making further notations more readable.

The coefficients of Rotation Matrix are:

$$\left\{\begin{array}{l} m_{11} = \cos\varphi\cdot\cos\kappa \\ m_{12} = \sin\omega\cdot\sin\varphi\cdot\cos\kappa + \cos\omega\cdot\sin\kappa \\ m_{13} = -\cos\omega\cdot\sin\varphi\cdot\cos\kappa + \sin\omega\cdot\sin\kappa \\ m_{21} = -\cos\varphi\cdot\sin\kappa \\ m_{22} = -\sin\omega\cdot\sin\varphi\cdot\sin\kappa + \cos\omega\cdot\cos\kappa \\ m_{23} = \cos\omega\cdot\sin\varphi\cdot\sin\kappa + \sin\omega\cdot\cos\kappa \\ m_{31} = \sin\varphi \\ m_{32} = -\sin\omega\cdot\cos\varphi \\ m_{33} = \cos\omega\cdot\cos\varphi \end{array}\right\} \quad \text{Eq. 2}$$

Where:

ω=ROLL, which is projector rotation around the axis parallel to the X axis of the World Frame.

Φ=PITCH, which is projector rotation around once rotated y axis.

κ=YAW, which is projector rotation around twice rotated z axis.

Positive rotation angle is counterclockwise when looking from the positive end of the respective axis.

The projector beam steering equations for the galvanometers for the case with no orthogonality correction are:

$$\left|\begin{array}{l} \tan(V) = \dfrac{u}{t} \\ \quad = \dfrac{m_{21}\cdot(x-PX) + m_{22}\cdot(y-PY) + m_{23}\cdot(z-PZ)}{m_{31}\cdot(x-PX) + m_{32}\cdot(y-PY) + m_{33}\cdot(z-PZ)} \\ \tan(H) = \dfrac{s\cdot\cos(V)}{e\cdot\cos(V) - t} \\ \quad = \dfrac{(m_{11}\cdot(x-PX) + m_{12}\cdot(y-PY) + m_{13}\cdot(z-PZ))}{e\cdot\cos V - (m_{31}\cdot(x-PX) + m_{32}\cdot(y-PY) + m_{33}\cdot(z-PZ))} \end{array}\right| \quad \text{Eq. 3}$$

Where:

V is the vertical beam steering angle corresponding axis $y_P$ of the Projector Frame(radians, optical).

H is the horizontal beam steering angle corresponding axis $x_P$ of the Projector Frame(radians, optical).

e is the separation distance between two beam steering mirrors.

For the system to project properly, Equation 3 is used in two processes. First, projector virtual alignment is determined, which includes finding six projector location parameters a), ω, Φ, κ, PX, PY, PZ by measuring beam steering angles H and V for at least three reference targets with known positions x, y, z in the World Frame. The second process involves projecting an actual template while steering the beam with computing angles H and V based on known projector location parameters ω, Φ, κ, PX, PY, PZ, and known template points x, y, z in the World frame.

The first process requires solving a system of at least six non-linear equations represented by Eq. 3a that are, in fact, a repeated superset of Equation 3.

$$\tan(V_1) = -\frac{u_1}{t_1} = -\frac{m_{21}\cdot(x_1-PX) + m_{22}\cdot(y_1-PY) + m_{23}\cdot(z_1-PZ)}{m_{31}\cdot(x_1-PX) + m_{32}\cdot(y_1-PZ) + m_{33}\cdot(z_1-PZ)} \quad \text{Eq. 3a}$$

-continued $$\tan(H_1) = \frac{s_1 \cdot \cos(V_1)}{e \cdot \cos(V_1) - t_1} = \frac{(m_{11} \cdot (x_1 - PX) + m_{12} \cdot (y_1 - PY) + m_{13} \cdot (z_1 - PZ)) \cdot \cos(V_1)}{e \cdot \cos(V_1) - (m_{31} \cdot (x_1 - PX) + m_{32} \cdot (y_1 - PY) + m_{33} \cdot (z_1 - PZ))}$$

$$\tan(V_2) = -\frac{u_2}{t_2} = -\frac{m_{21} \cdot (x_2 - PX) + m_{22} \cdot (y_2 - PY) + m_{23} \cdot (z_2 - PZ)}{m_{31} \cdot (x_2 - PX) + m_{32} \cdot (y_2 - PZ) + m_{33} \cdot (z_2 - PZ)}$$

$$\tan(H_2) = \frac{s_2 \cdot \cos(V_2)}{e \cdot \cos(V_2) - t_2} = \frac{(m_{11} \cdot (x_2 - PX) + m_{12} \cdot (y_2 - PY) + m_{13} \cdot (z_2 - PZ)) \cdot \cos(V_2)}{e \cdot \cos(V_2) - (m_{31} \cdot (x_2 - PX) + m_{32} \cdot (y_2 - PY) + m_{33} \cdot (z_1 - PZ))}$$

$$\tan(V_3) = -\frac{u_3}{t_3} = -\frac{m_{21} \cdot (x_3 - PX) + m_{22} \cdot (y_3 - PY) + m_{23} \cdot (z_3 - PZ)}{m_{31} \cdot (x_3 - PX) + m_{32} \cdot (y_3 - PZ) + m_{33} \cdot (z_3 - PZ)}$$

$$\tan(H_3) = \frac{s_3 \cdot \cos(V_3)}{e \cdot \cos(V_3) - t_3} = \frac{(m_{11} \cdot (x_3 - PX) + m_{12} \cdot (y_3 - PY) + m_{13} \cdot (z_3 - PZ)) \cdot \cos(V_3)}{e \cdot \cos(V_3) - (m_{31} \cdot (x_3 - PX) + m_{32} \cdot (y_3 - PY) + m_{33} \cdot (z_3 - PZ))}$$

For more than three targets, Equation 3a will have more equations but the same six unknowns (ω, Φ, κ, PX, PY, PZ), e.g. the system becomes over-determined. However, in practice six reference points are used because there are point locations that cause solution divergence if only three reference points are used. Using six points reduces the likelihood that a diverging solution will occur.

The second process involves the direct computation of tan(H) and tan(V) using formulas in Equation 3 for each projecting point and then finding the arctangents.

In order to solve Equation 3a, they must be linearized. Linearization is described below using as an example the system represented by Eq. 3.

Equation 3 is linearized following Taylor's Theorem and building the following auxiliary functions:

$$F = t \cdot \tan(V) + u = 0$$

$$G = e \cdot os(V)\tan(H) - t \cdot \tan(H)s \cdot \cos(V) = 0 \qquad \text{Eq.4}$$

According to Taylor's Theorem:

$$(F)_0 + \left(\frac{\partial F}{\partial \omega}\right)_0 \cdot d\omega + \left(\frac{\partial F}{\partial \varphi}\right)_0 \cdot d\varphi + \left(\frac{\partial F}{\partial \kappa}\right)_0 \cdot d\kappa + \left(\frac{\partial F}{\partial PX}\right)_0 \cdot dPX + \left(\frac{\partial F}{\partial PY}\right)_0 \cdot dPY + \left(\frac{\partial F}{\partial PZ}\right) \cdot dPZ = 0 \qquad \text{Eq. 5.1}$$

Where:

$$(G)_0 + \left(\frac{\partial G}{\partial \omega}\right)_0 \cdot d\omega + \left(\frac{\partial G}{\partial \varphi}\right)_0 \cdot d\varphi + \left(\frac{\partial G}{\partial \kappa}\right)_0 \cdot d\kappa + \left(\frac{\partial G}{\partial PX}\right)_0 \cdot dPX + \left(\frac{\partial G}{\partial PY}\right)_0 \cdot dPY + \left(\frac{\partial G}{\partial PZ}\right) \cdot dPZ = 0 \qquad \text{Eq. 5.2}$$

$(F)_0$ and $(G)_0$ are functions from expressions in Eq. 4 evaluated at initial approximations for the six unknowns ($\omega_0$, $\Phi_0$, $\kappa_0$, $PX_0$, $PY_0$, $PZ_0$), terms $(\partial F/\partial\omega)_0$, etc., are partial derivatives of the functions F and G with respect to indicated unknowns evaluated at the initial approximations, dω, dΦ, etc., are unknown corrections to be applied to the initial approximations.

Equations 5.1 and 5.2 are actually linear equations with respect to the unknown corrections:

$$\left\{\begin{array}{c} a_{11} \cdot d\omega + a_{12} \cdot d\varphi + a_{13} \cdot d\kappa + a_{14} \cdot dPX + \\ a_{15} \cdot dPY + a_{16} \cdot dPZ + b_1 = 0 \\ a_{21} \cdot d\omega + a_{22} \cdot d\varphi + a_{23} \cdot d\kappa + a_{24} \cdot dPX + \\ a_{25} \cdot dPY + a_{26} \cdot dPZ + b_2 = 0 \end{array}\right\} \qquad \text{Eq. 6}$$

Where:

$$b_1 = (F)_0$$

$$a_{11} = (\partial F/\partial\omega)_0,$$

$$a_{12} = (\partial F/\partial\Phi)_0,$$

$$a_{13} = (\partial F/\partial\kappa)_0,$$

$$a_{14} = (\partial F/\partial PX)_0,$$

$$a_{15} = (\partial F/\partial PY)_0,$$

$$a_{16} = (\partial F/\partial Z)_0, \qquad \text{Eq. 6a}$$

$$b_2 = (G)_0$$

$$a_{21} = (\partial G/\partial\omega)_0,$$

$$a_{22} = (\partial G/\partial\Phi)_0,$$

$$a_{23} = (\partial G/\partial\kappa)_0,$$

$$a_{24} = (\partial G/\partial PX)_0,$$

$$a_{25} = (\partial G/\partial PY)_0,$$

$$a_{26} = (\partial G/\partial PZ)_0, \qquad \text{Eq. 6b}$$

If n reference targets are used, then there are going to be 2n linear equations. Those equations, illustrated by Eq. 7, are a superset of Eq. 6 in the same way Eq. 4a are the superset of Eq. 4.

$$\left\{\begin{array}{c} a_{11} \cdot d\omega + a_{12} \cdot d\varphi + a_{13} \cdot d\kappa + a_{14} \cdot dPX + \\ a_{15} \cdot dPY + a_{16} \cdot dPZ + b_1 = 0 \\ a_{21} \cdot d\omega + a_{22} \cdot d\varphi + a_{23} \cdot d\kappa + a_{24} \cdot dPX + \\ a_{25} \cdot dPY + a_{26} \cdot dPZ + b_2 = 0 \\ \hline a_{2n-1,1} \cdot d\omega + a_{2n-1,2} \cdot d\varphi + a_{2n-1,3} \cdot d\kappa + a_{2n-1,4} \cdot dPX + \\ a_{2n-1,5} \cdot dPY + a_{2n-1,6} \cdot dPZ + b_{2n-1} = 0 \\ a_{2n,1} \cdot d\omega + a_{2n,2} \cdot d\varphi + a_{2n,3} \cdot d\kappa + a_{2n,4} \cdot dPX + \\ a_{2n,5} \cdot dPY + a_{2n,6} \cdot dPZ + b_{2n} = 0 \end{array}\right\} \qquad \text{Eq. 7}$$

The system of equations represented by Eq. 7 is over-determined and has to be solved using the Least Square Method. As soon as Eq. 7 are solved and if the corrections found are not small enough, new approximations for ω, Φ, κ, PX, PY, PZ are computed:

$$\omega_1 = \omega_0 + d\omega;$$

$$\Phi_1 = \Phi_0 + d\Phi;$$

$\kappa_1 = \kappa_0 + d\kappa;$ $PX_1 = PX_0 + dPX;$ $PY_1 = PY_0 + dPY;$ $PZ_1 = PZ_0 + dPZ;$ Functions F and G and their derivatives are evaluated with these new approximations. A new system of equations are composed, which look the same as those in Eq. 7. The new system of equations has terms computed using the same formulas as shown in Eqs. 5.1 and 5.2 but only evaluated for that new step. After solving for the new system of equations, we again estimate corrections found, compose and solve a next system of equations and so forth, until corrections become less than a specified tolerance. In fact, the system of non-linear equations is being solved by linearizing them by way of the iterative converging process of solving a sequence of linear systems.

It is apparent that in the sequence of linear systems all terms of odd equations according to Eq. 6a can be calculated by substituting "generic" positions x, y, z with target positions $x_1$, $y_1$, $z_1$, then $x_2$, $y_2$, $z_2$, etc. and by evaluating Eq. 6a for the current iterative step k of approximation. The same process can be used to calculate all terms of even equations based on Eq. 6b.

Thus, it is enough to figure out "generic" formulas for all terms of equations (Eq. 6) to be able to program a computational engine for the iterative solving of system equations for k approximations.

By measuring the distance to the reference point and incorporating the distance measurement in the calculations, a system can be solved using only three reference points where at least the distance to one reference point is measured. The distance measurement gives stability to the projector equations for tan(H) and tan(V) and also prevents the equations for tan(H) and tan(V) from diverging under certain conditions such as when the reference point is directly below the projector, i.e. at the center of the laser-projector field of view. Unlike many laser projection systems that do not measure distance between the projector and the reference object/target, the distance measurement eliminates the need to use six reference points in order to reduce the probability of obtaining a diverging solution when only three reference points are used.

To include the distance measurement in the system equations, the basic formula is based on the geometric relationship of a right triangle $d^2 = x^2 + y^2$. The following equation is developed for measuring distance from the x-mirror and using x-y-z coordinates from the y-mirror. Using the basic algorithm for computing the relationship between the projector galvanometers and the projection surface for 3-D projection, the distance equation obtained is:

$$D^2 = X_p^2 + \left(e - \frac{Z_P}{\cos(V)}\right)^2 \quad \text{Eq. 8}$$

Where

D is the distance from the X mirror.

$X_p$ is the X-coordinate of point p in Projector frame e is the distance between the galvanometers.

$-Z_p/\cos(V)$ is based on the x, y and z coordinates of the Y mirror.

By substituting the $X_p$ and $Z_p$ for the s and t of Eq. 1 based on Y-mirror coordinates, the distance equation now is:

$$D^2 \cdot [\cos(V)]^2 = [s \cdot \cos(V)]^2 + [e \cdot \cos(v) - t]^2 \quad \text{Eq. 9}$$

As previously done with the beam steering equations, the distance equation is linearized using a Taylor series to form an auxiliary function E.

Accordingly, $$E = s^2 \cdot \cos^2(V) + (e \cdot \cos(V) - t)^2 - D^2 \cdot \cos^2(V) \quad \text{Eq. 10}$$

According to Taylor's Theorem:

$$(E)_0 + \left(\frac{\partial E}{\partial \omega}\right)_0 d\omega + \left(\frac{\partial E}{\partial \varphi}\right)_0 d\varphi + \left(\frac{\partial E}{\partial \kappa}\right)_0 d\kappa + \left(\frac{\partial E}{\partial PX}\right)_0 dPX + \left(\frac{\partial E}{\partial PY}\right)_0 dPY + \left(\frac{\partial E}{\partial PZ}\right)_0 dPZ = 0 \quad \text{Eq. 11}$$

Where:

$(E)_0$ is a function from the expression in Eq. 10 evaluated at initial approximations for the six unknowns ($\omega_0$, $\Phi_0$, $\kappa_0$, $PX_0$, $PY_0$, $PZ_0$), terms $(\partial E/\partial \omega)_0$, etc. are partial derivatives of the function E with respect to indicated unknowns evaluated at the initial approximations, $d\omega$, $d\Phi$, etc., are unknown corrections to be applied to the initial approximations.

Equation 11 is actually a linear equation with respect to the unknown corrections:

$$a_{31} \cdot d\omega + a_{32} \cdot d\Phi + a_{33} \cdot d\kappa + a_{34} \cdot dPX + a_{35} \cdot dPY + a_{36} \cdot dPZ + b_3 = 0 \quad \text{Eq. 12}$$

Where:

$B_3 = E$ $a_{31} = (\partial E/\partial \omega)_0,$ $a_{32} = (\partial E/\partial \Phi)_0,$ $a_{33} = (\partial E/\partial \kappa)_0,$ $a_{34} = (\partial E/\partial PX)_0,$ $a_{35} = (\partial E/\partial PY)_0,$ $a_{36} = (\partial E/\partial PZ)_0,$ Eq. 11 combined with the beam steering equations (Eq. 3) previously discussed provides a system where the distance from the projector to the object is measured. If three reference targets are used for determining distance, then there are going to be three linear equations (Eq. 3 plus Eq. 11). Thus if n targets are measured then there are going to be 3n linear equations. Those equations are a superset of Eq. 3 and Eq. 11. Solving the equations involve mathematical manipulations and substitutions, which someone skilled in the art is capable of performing. Thus, these further equations are not shown here. By incorporating the distance measurement in the system algorithms, there is prevented the accidental choice of a reference target that causes the equations to diverge instead of converge. Also by measuring the distance, there is no need to use more than three reference points to obtain system stability and accuracy.

Another important feature of the present invention is the method developed to project the laser beam. To cause projector 70 to project a straight line between two reference points, the system divides a straight line in 3-D into variable intervals. Further, projecting a piece of a straight line in 3-D space by steering a laser bearing involves generating a series of galvanometer position commands to implement a proper motion control velocity profile. To implement a proper motion control velocity profile involves dividing a straight line in 3-D into variable intervals.

According to analytical geometry, if a piece of line is divided with some aspect ratio then its projections on coordinate axes are divided with the same aspect ratio. For example, in 2-D space if you divide a piece of line by half, its projections are also divided by half. The same remains true for 3-D space. Thus, any sequence of filling points can be generated by generating proportional sequences of points for each line axial projection.

The solution described below is applicable to apiece of line ($P_1$ $P_2$) specified in the World (Tool) Frame.

First, scaled Initial Intervals are computed:

$$I_0x=(x_2-x_1)/N, \qquad \text{Eq. 13}$$

$$I_0y=(y_2-y_1)/N, \qquad \text{Eq. 14}$$

$$I_0z=(z_2-z_1)/N, \qquad \text{Eq. 15}$$

Where:

$I_0x$, $I_0y$, $I_0z$ are projections of the Initial Interval $I_0$ onto coordinate axes.

$x_1$, $y_1$, $z_1$, are coordinates of the beginning of the line being filled.

$x_2$, $y_2$, $z_2$, are coordinates at the end of that line.

N is a constant and equals the number of points filling the line uniformly with intervals equal to the initial interval $I_0$.

Second, Scale Functions (Interval Multipliers) are specified.

The variable filling interval is defined as a function of the relative distance from the initial point $P_1$ and is represented by the function:

$$F_{scale}=F(p/\Delta L), \qquad \text{Eq. 16}$$

Where:

$\Delta L$ is the full length of the piece of line in 3-D space, i.e. $\Delta L=(P_1\ P_2)$.

p is the variable absolute distance from the point $P_1$ Eq. 16 is defined on the interval (0, $\Delta L$).

The variable interval I can be expressed by the formula:

$$I=I_0*F_{scale}=I_0*F(p/\Delta L), \qquad \text{Eq. 17}$$

In order to match Eq. 17 with the definition of the initial interval Eqs. 13-15 we presume F(0)=1.

In accordance with the aspect ratio described earlier, the interval multiplier has to be the same for all three axes, x, y and z. Thus:

$$F(p/\Delta L)=F(p_x/\Delta X)=F(p_y/\Delta Y)=F(p_z/\Delta Z), \qquad \text{Eq. 18}$$

Where:

$p_x$, $p_y$, $p_z$ are projections of the variable distance p.

$\Delta X$, $\Delta Y$, $\Delta Z$ are projections of the full length $\Delta L$.

Eq. 18 can be rewritten as:

$$F(I/\Delta L)=F(x-x_1/x_2-x_1)=F(y-y_1/y_2-y_1)=F(z-z_1/z_2-z_1), \qquad \text{Eq. 19}$$

Function F can be continuous or segmented.

The following is an example of the segmented function F. Assume that the line is 100 mm long in 3-D space and that you wish to fill the last 25 mm of the line with intervals five times smaller than the first 75 mm of the line. The scale function F(x) for the X axis is:

$$F(x)=\left\{\begin{matrix} 1,\ \text{when } 0\le\frac{x-x_1}{x_2-x_1}<\frac{3}{4} \\ \frac{1}{5},\ \text{when } \frac{3}{4}\le\frac{x-x_1}{x_2-x_1}<1 \end{matrix}\right\} \qquad \text{Eq. 20}$$

Substituting x with y or z in the above expression, you get scale functions F(y) and F(z).

An array of fill points q(k) for the x-axis, y-axis and z-axis can be created using the following example of C code by substituting m with x, y and z in the code.

```
q=q1;

k=0;

q(0)=q;

while((q<x2)&&(q>=x1))

{q=q+I0*F(q);

k=k+1;

q(k)=q;}
```

Projecting a piece of straight line in 3-D space by steering the laser beam involves generating a series of galvanometer position commands to implement a proper motion control velocity profile. Unlike the discussion above that considered given intervals in length, servo commands usually are generated over the given fixed time intervals (ticks).

As an example, a trapezoidal velocity profile is used. Other profiles may be used and their subsequent equations determined. To project a straight line between points $P_1$ and $P_2$, you assume that you have computed coordinates of those points in the projector frame ($x_{P1}$, $y_{P1}$, $z_{P1}$ and $x_{P2}$, $y_{P2}$, $z_{P2}$) by using coordinate transform as well as the associated horizontal and vertical beam steering angles, i.e. galvanometer angles, ($H_1$, $H_2$ and $V_1$, $V_2$). You begin by figuring out proper trapezoidal profiles for the H and V galvanometers separately. Each galvanometer has acceleration and velocity limits. Trapezoidal velocity profiles may be computed based on those limits and on the angular travel distance $\Delta H=H_2-H_1$ and $\Delta V=V_2-V_1$.

The following is an algorithm to create a symmetrical trapezoidal velocity profile for linear travel. Calculate the maximum distance achievable with maximum constant acceleration a until the velocity limit $v_{lim}$ is reached:

$$S_{max}=\frac{v_{lim}^2}{2\cdot a} \qquad \text{Eq. 21}$$

Compare the maximum distance with the half of the distance to travel $\Delta L/2$. If $\Delta L/2<=S_{max}$, then it is going to be triangular velocity profile with the maximum velocity achieved at the center of the travel:

$$v_{max}=\sqrt{a\cdot\Delta L} \qquad \text{Eq. 22}$$

Compute triangular velocity profile parameters. Such a triangular velocity profile consists of two segments only, an acceleration segment and a deceleration segment. In the acceleration segment, its length $S_a$ and duration $t_a$ are given by:

$$S_a = \frac{v_{max}^2}{2 \cdot a} \quad \text{Eq. 23}$$

$$t_a = \frac{v_{max}}{a} \quad \text{Eq. 24}$$

In the deceleration segment, its length $S_d$ and duration $t_d$ are equal to $S_a$ and $t_a$. However, if $\Delta L/2 > S_{max}$, then the velocity profile is a trapezoidal velocity profile with the maximum velocity achieved at the end of the acceleration segment to be equal to $v_{lim}$.

To compute the trapezoidal velocity profile parameters, the trapezoidal velocity profiles consist of three segments, an acceleration segment, a constant velocity segment and a deceleration segment. In the acceleration segment, its length $S_a$ and duration $t_a$ may be computed by substituting $v_{lim}$ instead of $v_{max}$ into Eqs. 23 and 24. In the constant velocity ($v_{lim}$) segment, its length $S_c$ and duration $t_c$ are given by:

$$S_c = \Delta L - 2 \cdot S_a \quad \text{Eq. 25}$$

$$t_c = \frac{S_c}{v_{lim}} \quad \text{Eq. 26}$$

In the deceleration segment, its length $S_d$ and duration $t_d$ are equal to $S_a$ and $t_a$. The complete duration of the travel $\Delta L$ is given by:

$$T = t_a + t_c + t_d \quad \text{Eq. 27}$$

Equations 21 to 27 are used to compute trapezoidal velocity profiles for galvanometers by replacing linear distances, velocities and accelerations with angular values. So, $\Delta L$ is substituted by $\Delta H$ or $\Delta V$, and $S_a$, $S_c$, and $S_d$ is replaced with $H_a$, $H_c$ and $H_d$ or with $V_a$, $V_c$ and $V_d$.

After finding the trapezoidal velocity profiles for the H and V galvanometers, the velocity profile that has longer the travel time T is selected. The reason that the velocity profile with the longer travel time is chosen is that it is slower and, thus, dictates the pace of motion. Assuming that the slower velocity profile is the V galvanometer, the relative segment distances are computed:

$$R_a = V_a / \Delta V, \quad \text{Eq. 28}$$

$$R_c = V_c / \Delta V, \quad \text{Eq. 29}$$

$$R_d = V_d / \Delta V, \quad \text{Eq. 30}$$

Where the slower velocity profile is the H galvanometer, the following formulas are used:

$$R_a = H_a / \Delta H, \quad \text{Eq. 31}$$

$$R_c = H_c / \Delta H, \quad \text{Eq. 32}$$

$$R_d = H_d / \Delta H, \quad \text{Eq. 33}$$

In reality, the beam steering angles H and V are related to the point position ($x_P$, $y_P$, $z_P$) in the projector frame by way of non-linear equations, previously described by Eq. 3.

$$\begin{Bmatrix} \tan(V) = -\dfrac{y_P}{z_P} \\ \tan(H) = \dfrac{x_P \cdot \cos(V)}{e \cdot \cos(V) - z_P} \end{Bmatrix} \quad \text{Eq. 34}$$

Despite the actual non-linearity of Eq. 34; approximations are used because the distances along axes $x_p$ and $y_p$ are proportional to the corresponding beam steering angles H and V. This allows the trapezoidal profile parameters that are valid to project the straight line ($P_1$ $P_2$) to be computed. The projected setpoints for the axes $x_p$, $y_p$ and $z_p$ are then calculated. Finally, the real setpoints for the galvanometers H and V using Equation 34 are computed. Because of non-linearity of Eq. 34, the resulting servo motion velocity profiles for the galvanometers are neither precisely trapezoidal nor do they have precisely maximum velocities and accelerations expected from the initially defined angular segments $H_a$, $H_c$, and $H_d$ or $V_a$, $V_c$ and $V_d$. Nevertheless, the projected line will be precisely straight. For most practical applications, the acceleration and velocity errors do not exceed ±10%. Based on the principle of proportionality between projections (see Equations 18 and 19, and as previously discussed) then:

$$R_a = x_a/|x_{P2} - x_{P1}| = y_a/|y_{P2} - y_{P1}| = z_a/|z_{P2} - z_{P1}| \quad \text{Eq. 37}$$

$$R_c = x_c/|x_{P2} - x_{P1}| = y_c/|y_{P2} - y_{P1}| = z_c/|z_{P2} - z_{P1}| \quad \text{Eq. 38}$$

$$R_d = x_d/|x_{P2} - x_{P1}| = y_d/|y_{P2} - y_{P1}| = z_d/|z_{P2} - z_{P1}| \quad \text{Eq. 39}$$

Where: $x_a$, $x_c$, $x_d$, $y_a$, $y_c$, $y_d$, $z_a$, $z_c$, and $z_d$ are projected components of trapezoidal profile segments.

Where the relative segment distances from Equations 28 to 30 or from Equations 31 to 33 are known, the length of each of the projected components are:

$$x_{a,c,d} = R_{a,c,d} \cdot (x_{P2} - x_{P1}) \quad \text{Eq. 40}$$

$$y_{a,c,d} = R_{a,c,d} \cdot (y_{P2} - y_{P1}) \quad \text{Eq. 41}$$

$$z_{a,c,d} = R_{a,c,d} \cdot (z_{P2} - x_{P1}) \quad \text{Eq. 42}$$

Projected accelerations and projected maximum velocity are calculated:

$$\left. \begin{aligned} a_x &= \frac{2 \cdot x_{a,c,d}}{t_a^2} \\ a_y &= \frac{2 \cdot y_{a,c,d}}{t_a^2} \\ a_z &= \frac{2 \cdot z_{a,c,d}}{t_a^2} \end{aligned} \right| \quad \text{Eq. 43}$$

$$\left. \begin{aligned} v_{xmax} &= a_x \cdot t_a, \\ v_{ymax} &= a_y \cdot t_a \\ v_{zmax} &= a_z \cdot t_a, \end{aligned} \right| \quad \text{Eq. 44}$$

From the above, projected setpoints (i=0, 1, 2 . . . ) for the given time interval $\tau$ are generated for x, y and z. The equations for the x values are shown. By substituting y and z for x, the y and z equations are similar:

$$\begin{cases} x_{P1} + \frac{a_x}{2}\cdot(i\cdot\tau)^2, & \text{when } (i\cdot\tau) \le t_a \\ x_{P1} + \frac{a_x}{2}\cdot t_a^2 + v_{xmax}\cdot(i\cdot\tau - t_a), & \text{when } t_a < (i\cdot\tau) \le t_a + t_c \\ x_{P1} + \frac{a_x}{2}t_a^2 + v_{xmax}\cdot t_c + v_{xmax}\cdot(i\cdot\tau - t_a - t_c) - & \\ \frac{a_x}{2}\cdot(i\cdot\tau - t_a - t_c)^2, & \text{when } t_a + t_c < (i\cdot\tau) \le T \\ x_{P2}, & \text{when } (i\cdot\tau) > T \end{cases} \quad \text{Eq. 45}$$

Finally, the real setpoints for the galvanometers are computed by substituting projected setpoints (Equation 45 for x, y and z) into the Equation 34:

$$V(i\cdot\tau) = -\arctan\left(\frac{y_P(i\cdot\tau)}{z_P(i\cdot\tau)}\right) \quad \text{Eq. 46}$$

$$H(i\cdot\tau) = \arctan\left(\frac{x_P(i\cdot\tau)\cos(V(i\cdot\tau))}{e\cdot\cos(V(i\cdot\tau)) - z_P(i\cdot\tau)}\right) \quad \text{Eq. 47}$$

Imaging compositions include one or more sensitizer in sufficient amounts to cause a color or shade change in the compositions upon application of a sufficient amount of energy. Typically, the imaging compositions include one or more sensitizers activated at energy levels of 5 mW or less. The compositions may be applied to a work piece followed by applying a sufficient amount of energy from a 3-D imaging system to cause color or shade change on the entire work piece, or to form a patterned image on the work piece. For example, an imaging composition may be applied selectively to a work piece followed by the application of energy to cause a color or shade change to produce a patterned image on the work piece. Alternatively, the composition may cover the entire work piece and the energy applied selectively to cause a color or shade change to form a patterned image.

In addition to sensitizers, the imaging compositions may include reducing agents, oxidizing agents, chain transfer agents, color formers, plasticizers, acids, adhesion promoters, rheological modifiers, adhesives, surfactants, thickeners, diluents and other components to tailor the compositions for a desired response and work-piece.

Sensitizers employed in the compositions are compounds, which are activated by energy to change color or shade, or upon activation cause one or more other compounds to change color or shade. The imaging compositions include one or more photosensitizers sensitive to visible light and may be activated with energy at powers of 5 mW or less. Generally, such sensitizers are included in amounts of from 0.005 wt % to 10 wt %, or such as from 0.05 wt % to 5 wt %, or such as from 0.1 wt % to 1 wt % of the composition.

Sensitizers, which are activated in the visible range, typically are activated at wavelengths of from above 300 nm to less than 600 nm, or such as from 350 nm to 550 nm, or such as from 400 nm to 535 nm. Such sensitizers include, but are not limited to cyclopentanone based conjugated compounds such as cyclopentanone, 2,5-bis-[4-(diethylamino)phenyl]methylene]-, cyclopentanone, 2,5-bis[(2,3,6,7-tetrahydro-1H,5H-benzo[i,j]quinolizin-9-yl)methylene]-, and cyclopentanone, 2,5-bis-[4-(diethyl-amino)-2-methylphenyl]methylene]-. Such cyclopentanones may be prepared from cyclic ketones and tricyclic aminoaldehydes by methods known in the art.

Examples of such suitable conjugated compounds have the following formula:

(I)

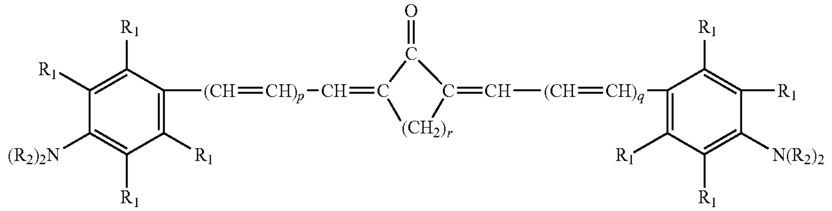

where p and q independently are 0 or 1, r is 2 or 3; and $R_1$ is independently hydrogen, linear or branched ($C_1$-$C_{10}$) aliphatic, or linear or branched ($C_1$-$C_{10}$)alkoxy, typically $R_1$ is independently hydrogen, methyl or methoxy; $R_2$ is independently hydrogen, linear or branched ($C_1$-$C_{10}$)aliphatic, ($C_5$-$C_7$)ring, such as an alicyclic ring, alkaryl, phenyl, linear or branched ($C_1$-$C_{10}$) hydroxyalkyl, linear or branched hydroxy terminated ether such as $-(CH_2)_v-O-(CHR_3)_w-OH$, where v is an integer of from 2 to 4, w is an integer of from 1 to 4, and $R_3$ is hydrogen or methyl, and carbons of each $R_2$ may be taken together to form a 5 to 7 membered ring with the nitrogen, or a 5 to 7 membered ring with the nitrogen and with another heteroatom chosen from oxygen, sulfur, and a second nitrogen. Such sensitizers may be activated at powers of 5 mW or less.

Other sensitizers which are activated in the visible light range include, but are not limited to N-alkylamino aryl ketones such as bis(9-julolidyl ketone), bis-(N-ethyl-1,2,3,4-tetrahydro-6-quinolyl)ketone and p-methoxyphenyl-(N-ethyl-1,2,3,4-tetrahydro-6-quinolyl)ketone; visible light absorbing dyes prepared by base catalyzed condensation of an aldehyde or dimethinehemicyanine with the corresponding ketone; visible light absorbing squarylium compounds; 1,3-dihydro-1-oxo-2H-indene derivatives; coumarin based dyes such as ketocoumarin, and 3,3'-carbonyl bis(7-diethylaminocoumarin); halogenated titanocene compounds such as bis(.eta.5-2,4-cyclopentadien-1-yl)-bis(2,6-difluro-3-(1H-pyrrol-1-yl)-phenyl) titanium; and compounds derived from aryl ketones and p-dialkylaminoarylaldehydes. Examples of additional sensitizers include fluorescein type dyes and light absorber materials based on the triarylmethine nucleus. Such compounds include Eosin, Eosin B, and Rose Bengal. Another suitable compound is Erythrosin B. Methods of making such sensitizers are known in the art, and many are commercially available. Typically, such visible light activated sensitizers are used in amounts of from 0.05 wt % to 2 wt %, or such as from 0.25 wt % to 1 wt %, or such as from 0.1 wt % to 0.5 wt % of the composition.

Optionally, sensitizers activated by UV light may be used. Typically such sensitizers are activated at wavelengths of from above 10 nm to less than 300 nm, or such as from 50 nm to 250 nm, or such as from 100 nm to 200 nm. Such UV activated sensitizers include, but are not limited to, polymeric sensitizers having a weight average molecular weight of from 10,000 to 300,000 such as polymers of 1-[4-(dimethylamino) phenyl]-1-(4-methoxyphenyl)-methanone, 1-[4-(dimethylamino)phenyl]-1-(4-hydroxyphenyl)-methanone and 1-[4-(dimethylamino)phenyl]-1-[4-(2-hydroxyethoxy)-phenyl]-methanone; free bases of ketone imine dyestuffs; amino derivatives of triarylmethane dyestuffs; amino derivatives of xanthene dyestuffs; amino derivatives of acridine dyestuffs; methine dyestuffs; and polymethine dyestuffs. Methods of preparing such compounds are known in the art. Typically, such UV activated sensitizers are used in amounts of from 0.05 wt % to 1 wt %, or such as from 0.1 wt % to 0.5 wt % of the composition.

Optionally, sensitizers activated by IR light may be used. Typically such sensitizers are activated at wavelengths of from greater than 600 nm to less than 1,000 nm, or such as from 700 nm to 900 nm, or such as from 750 nm to 850 nm. Such IR activated sensitizers include, but are not limited to infrared squarylium dyes, and carbocyanine dyes. Such dyes are known in the art and may be made by methods described in the literature. Typically, such dyes are included in the compositions in amounts of from 0.05 wt % to 3 wt %, or such as from 0.5 wt % to 2 wt %, or such as from 0.1 wt % to 1 wt % of the composition.

Compounds which may function as reducing agents include, but are not limited to, one or more quinone compounds such as pyrenequinones such as 1,6-pyrenequinone and 1,8-pyrenequinone; 9,10-anthrquinone, 1-chloroanthraquinone, 2-chloro-anthraquinone, 2-methylanthrquinone, 2-ethylanthraquinone, 2-tert-butylanthraquinone, octamethylanthraquinone, 1,4-naphthoquinone, 9,10-phenanthrenequinone, 1,2-benzaanthrquinone, 2,3-benzanthraquinone, 2-methyl-1,4-naphthoquinone, 2,3-dichloronaphthoquinone, 1,4-dimethylanthraquinone, 2,3-dimethylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione.

Other compounds which may function as reducing agents include, but are not limited to, acyl esters of triethanolamines having a formula:

$$N(CH_2CH_2OC(O)—R)_3 \qquad (II)$$

where R is alkyl of 1 to 4 carbon atoms, and 0 to 99% of a $C_1$ to $C_4$ alkyl ester of nitrilotriacetic acid or of 3,3',3"-nitrilotripropionic acid. Examples of such acyl esters of triethanolamine are triethanolamine triacetate and dibenzylethanolamine acetate.

One or more reducing agent may be used in the imaging compositions to provide the desired color or shade change. Typically, one or more quinone is used with one or more acyl ester of triethanolamine to provide the desired reducing agent function. Reducing agents may be used in the compositions in amounts of from 0.05 wt % to 50 wt %, or such as from 5 wt % to 40 wt %, or such as 20 wt % to 35 wt %.

Chain transfer agents are included to accelerate the rate of color or shade change. Typically, the rate of color change or shade change increases 2× to 10× or such as from 4× to 8× with the addition of one or more chain transfer agents.

One or more chain transfer agents or accelerators may be used in the imaging compositions. Such accelerators increase the rate at which the color or shade change occurs after exposure to energy. Any compound which accelerates the rate of color or shade change may be used. Chain transfer agents may be included in the compositions in amounts of from 0.01 wt % to 25 wt %, or such as from 0.5 wt % to 10 wt %. Examples of suitable accelerators include onium salts, and amines.

Suitable onium salts include, but are not limited to, onium salts in which the onium cation is iodonium or sulfonium such as onium salts of arylsulfonyloxybenzensulfonate anions, phosphonium, oxysulfoxonium, oxysulfonium, sulfoxonium, ammonium, diazonium, selononium, arsonium, and N-substituted N-heterocyclic onium in which N is substituted with a substituted or unsubstituted saturated or unsaturated alkyl or aryl group.

The anion of the onium salts may be, for example, chloride, or a non-nucleophilic anion such as tetrafluoroborate, hexafluorophosphate, hexafluoroarsenate, hexafluoroantimonate, triflate, tetrakis-(pentafluorophenyl)borate, pentafluoroethyl sulfonate, p-methyl-benzyl sulfonate, ethylsulfonate, trifluoromethyl acetate and pentafluoroethyl acetate.

Examples of typical onium salts include, for example, diphenyl iodonium chloride, diphenyliodonium hexafluorophosphate, diphenyl iodonium hexafluoroantimonate, 4,4'-dicumyliodonium chloride, 4,4'dicumyliodonium hexofluorophosphate, N-methoxy-a-picolinium-p-toluene sulfonate, 4-methoxybenzene-diazonium tetrafluoroborate, 4,4'-bis-dodecylphenyliodonium-hexafluoro phosphate, 2-cyanoethyl-triphenylphosphonium chloride, bis-[4-diphenylsulfonionphenyl]sulfide-bis-hexafluoro phosphate, bis-4-dodecylphenyliodonium hexafluoroantimonate, and triphenylsulfonium hexafluoroantimonate.

Suitable amines include, but are not limited to primary, secondary and tertiary amines such as methylamine, diethylamine, triethylamine, heterocyclic amines such as pyridine and piperidine, aromatic amines such as aniline, quaternary ammonium halides such as tetraethylammonium fluoride, and quaternary ammonium hydroxides such as tetraethylammonium hydroxide. The triethanolamines having formula (II) also have accelerator activities.

Color formers also may be used to affect a color of shade change. Examples of such color formers are leuco-type compounds such as aminotriarylmethanes, aminoxanthenes, aminothioxanthenes, amino-9,10-dihydroacridines, aminophenoxazines, aminophenothiazines, aminodihydrophenazines, antinodiphenylmethines, leuco indamines, aminohydrocinnamic acids such as cyanoethanes and leuco methines, hydrazines, leuco indigoid dyes, amino-2,3-dihydroanthraquinones,tetrahalo-p,p'-biphenols, 2(p-hydroxyphenyl)-4,5-diphenylimidazoles, and phenethylanilines. Such compounds are included in amounts of from 0.1 wt % to 5 wt %, or such as from 0.25 wt % to 3 wt %, or such as from 0.5 wt % to 2 wt % of the composition.

When leuco-type compounds are included in the compositions, one or more oxidizing agent is typically included. Compounds, which may function as oxidizing agents include, but are not limited to, hexaarylbiimidazole compounds such as 2,4,5,2',4',5'-hexaphenylbiimidazole, 2,2',5-tris(2-chlorophenyl)-4-(3,4-dimethoxyphenyl)-4,5-diphenylbiimidazole (and isomers), 2,2'-bis(2-ethoxyphenyl)-4,4',5,5',-tetraphenyl-1,1'-bi-1H-mimidazole, and 2,2'-di-1-naphthalenyl-4,4',5,5'-tetraphenyl-1'-bi-1H-imidazole. Other suitable compounds include, but are not limited to, halogenated compounds with a bond dissociation energy to produce a first halogen as a free radical of not less than 40 kilocalories per mole, and having not more than one hydrogen attached thereto; a sulfonyl halide having a formula: R'—$SO_2$—X where R' is an alkyl, alkenyl, cycloalkyl, aryl, alkaryl, or aralkyl and X is chlorine or bromine; a sulfenyl halide of the formula: R"—S—X' where R" and X' have the same meaning as R' and X above; tetraaryl hydrazines, benzothiazolyl disulfides, polymetharylaldehyds, alkylidene 2,5-cyclohexadien-1-ones, azobenzyls, nitrosos, alkyl (T1), peroxides, and haloamines. Such compounds are included in the compositions in amounts of from 0.25 wt % to 10 wt %, or such as from 0.5 wt % to 5 wt %, or such as from 1 wt % to 3 wt % of the composition. Methods are known in the art for preparing the compounds and many are commercially available.

Film forming polymers may be included in the imaging compositions to function as binders for the compositions. Any film forming binder may be employed in the formulation of the compositions provided that the film forming polymers do not interfere with the desired color or shade change. The film forming polymers are included in amounts of from 10 wt % to 90 wt %, or such as from 15 wt % to 70 wt %, or such as from 25 wt % to 60 wt % of the compositions. Typically, the film forming polymers are derived from a mixture of acid functional monomers and non-acid functional monomers. The acid and non-acid functional monomers are combined to form copolymers such that the acid number ranges from at least 80, or such as from 150 to 250. Examples of suitable acid functional monomers include (meth)acrylic acid, maleic acid, fumaric acid, citraconic acid, 2-acrylamido-2-methylpropanesulfonic acid, 2-hydroxyethyl acrylolyl phosphate, 2-hydroxypropyl acrylol phosphate, and 2-hydroxy-alpha-acryloyl phosphate.

Examples of suitable non-acid functional monomers include esters of (meth)acrylic acid such as methyl acrylate, 2-ethyl hexyl acrylate, n-butyl acrylate, n-hexyl acrylate, methyl methacrylate, hydroxyl ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethyylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2,2-di(p-hydroxyphenyl)-propane dimethacrylate, triethylene glycol dimethacrylate, polyoxypropyltrimethylol propane triacrylate, ethylene glycol dimethacrylate, butylenes glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate; styrene and substituted styrene such as 2-methyl styrene and vinyl toluene and vinyl esters such as vinyl acrylate and vinyl methacrylate.

Other suitable polymers include, but are not limited to, nonionic polymers such as polyvinyl alcohol, polyvinyl pyrrolidone, hydroxyl-ethylcellulose, and hydroxyethylpropyl methylcellulose.

Optionally, one or more plasticizers also may be included in the compositions. Any suitable plasticizer may be employed. Plasticizers may be included in amounts of from 0.5 wt % to 15 wt %, or such as from 1 wt % to 10 wt % of the compositions. Examples of suitable plasticizers include phthalate esters such as dibutylphthalate, diheptylphthalate, dioctylphthalate and diallylphthalate, glycols such as polyethylene glycol and polypropylene glycol, glycol esters such as triethylene glycol diacetate, tetraethylene glycol diacetate, and dipropylene glycol dibenzoate, phosphate esters such as tricresylphosphate, triphenylphosphate, amides such as p-toluenesulfoneamide, benzenesulfoneamide, N-n-butylacetoneamide, aliphatic dibasic acid esters such as diisobutyladipate, dioctyladipate, dimethylsebacate, dioctylazelate, dibutylmalate, triethylcitrate, tri-n-butylacetylcitrate, butyllaurate, dioctyl-4,5-diepoxycyclohexane-1,2-dicarboxylate, and glycerine triacetylesters.

Optionally, one or more flow agents also may be included in the compositions. Flow agents are compounds, which provide a smooth and even coating over a substrate. Flow agents may be included in amounts of from 0.05 wt % to 5 wt % or such as from 0.1 wt % to 2 wt % of the compositions. Suitable flow agents include, but are not limited to, copolymers of alkylacrylates. An example of such alkylacrylates is a copolymer of ethyl acrylate and 2-ethylhexyl acrylate.

Optionally, one or more organic acids may be employed in the compositions. Organic acids may be used in amounts of from 0.01 wt % to 5 wt %, or such as from 0.5 wt % to 2 wt %. Examples of suitable organic acids include formic acid, acetic acid, propionic acid, butyric acid, valeric acid, caproic acid, caprylic acid, capric acid, lauric acid, phenylacetic acid, benzoic acid, phthalic acid, isophthalic acid, terephthalic acid, adipic acid, 2-ethylhexanoic acid, isobutyric acid, 2-methylbutyric acid, 2-propylheptanoic acid, 2-phenylpropionic acid, 2-(p-isobutylphenyl)propionic acid, and 2-(6-methoxy-2-naphthyl)propionic acid.

Optionally, one or more surfactants may be used in the compositions. Surfactants may be included in the compositions in amounts of from 0.5 wt % to 10 wt %, or such as from 1 wt % to 5 wt % of the composition. Suitable surfactants include non-ionic, ionic and amphoteric surfactants. Examples of suitable non-ionic surfactants include polyethylene oxide ethers, derivatives of polyethylene oxides, aromatic ethoxylates, acetylenic ethylene oxides and block copolymers of ethylene oxide and propylene oxide. Examples of suitable ionic surfactants include alkali metal, alkaline earth metal, ammonium, and alkanol ammonium salts of alkyl sulfates, alkyl ethoxy sulfates, and alkyl benzene sulfonates. Examples of suitable amphoteric surfactants include derivatives of aliphatic secondary and tertiary amines in which the aliphatic radical may be straight chain or branched and where one or the aliphatic substituents contains from 8 to 18 carbon atoms and one contains an anionic water solubilizing group such as carboxy, sulfo, sulfato, phosphate, or phosphono. Specific examples of such amphoteric surfactants are sodium 3-dodecylaminopropionate and sodium 3-dodecylaminopropane sulfonate.

Thickeners may be included in the imaging compositions in conventional amounts. Any suitable thickener may be incorporated in the imaging compositions. Typically, thickeners range from 0.05 wt % to 10 wt %, or such as from 1 wt % to 5 wt % of the compositions. Conventional thickeners may be employed. Examples of suitable thickeners include low molecular weight polyurethanes such as having at least three hydrophobic groups interconnected by hydrophilic polyether groups. The molecular weight of such thickeners ranges from 10,000 to 200,000. Other suitable thickeners include hydrophobically modified alkali soluble emulsions, hydrophobically modified hydroxyethyl cellulose and hydrophobically modified polyacrylamides.

Diluents may be included in the compositions to provide a vehicle or carrier for the other components. Diluents are added as needed. Solid diluents or fillers are typically added in amounts to bring the dry weight of the compositions to 100 wt %. Examples of solid diluents are celluloses. Liquid diluents or solvents are employed to make solutions, suspensions or emulsions of the active components of the compositions. The solvents may be aqueous or organic, or mixtures thereof. Examples of organic solvents include alcohols such as methyl, ethyl, and isopropyl alcohol, propanols, diisopropyl ether, diethylene glycol dimethyl ether, 1,4-dioxane, terahydrofuran or 1,2-dimethoxy propane, and ester such as butyrolactone, ethylene glycol carbonate and propylene glycol carbonate, an ether ester such as methoxyethyl acetate, ethoxyethyl acetate, 1-methoxypropyl-2-acetate, 2-methoxypropyl-1-acetate, 1-ethoxypropyl-2-acetate and 2-ethoxypropyl-1-acetate, ketones such as acetone and methylethyl ketone, nitriles such as acetonitrile, propionitrile and methoxypropionitrile, sulfones such as sulfolan, dimethylsulfone and diethylsulfone, and phosphoric acid esters such as trimethyl phosphate and triethyl phosphate.

The imaging compositions may be in the form of a concentrate. In such concentrates, the solids content may range from 80 wt % to 98 wt %, or such as from 85 wt % to 95 wt %. Concentrates may be diluted with water, one or more organic solvents, or a mixture of water and one or more organic solvents. Concentrates may be diluted such that the solids content ranges from 5 wt % to less than 80 wt %, or such as from 10 wt % to 70 wt %, or such as from 20 wt % to 60 wt %.

Optionally, adhesives may be included in the imaging compositions. Any suitable adhesive may be employed. The adhesive may be a permanent adhesive, a semi-permanent, a repositional adhesive, a releasable adhesive, or freezer category adhesive. Many of such adhesives may be classified as hot-melt, hot-melt pressure sensitive, and pressure sensitive adhesives. Typically, the releasable adhesives are pressure sensitive adhesives. Examples of such releasable, pressure sensitive adhesives are acrylics, polyurethanes, poly-alpha-olefins, silicones, combinations of acrylate pressure sensitive adhesives and thermoplastic elastomer-based pressure sensitive adhesives, and tackified natural and synthetic rubbers. Adhesives may be employed in the imaging compositions in amounts of from 0.05 wt % to 10 wt %, or such as 0.1 wt % to 5 wt %, or such as 1 wt % to 3 wt % of the compositions.

The compositions may be applied to a work piece such as by spray coating, roller coating or laminating. Any solvent or residual solvent may be driven off by air drying or by applying a sufficient amount of heat from a hot-air dryer to form cohesion between the composition and the work piece.

Optionally, the imaging compositions may be applied to a film substrate with an adhesive portion applied to the opposite side of the film substrate. An example of such a film substrate is an adhesive tape. Energy-sensitive compositions are coated on one side of the film in layers of from 0.5 mm to 10 mm, or such as from 1 mm to 5 mm. Coating may be done by conventional methods such as spray coating, roller coating, or by brushing. The adhesives are coated on the opposite side of the film in amounts of from 25 micrometers to 1,000 micrometers or such as from 50 micrometers to 400 micrometers.

Representative examples of materials suitable for the film substrate include polyolefins such as polyethylene, including high density polyethylene, low density polyethylene, linear low density polyethylene, and linear ultra low density polyethylene, polypropylene, and polybutylenes; vinyl copolymers such as polyvinyl chlorides, both plasticized and unplasticized, and polyvinyl acetates; olefinic copolymers such as ethylene/methacrylate copolymers, ethylene/vinyl acetate copolymers, acrylonitrile-butadiene-styrene copolymers, and ethylene/propylene copolymers; acrylic polymers and copolymers; cellulose; polyesters; and combinations of the foregoing. Mixtures or blends of any plastic or plastic and elastomeric materials such as polypropylene/polyethylene, polyurethane/polyolefin, polyurethane/polycarbonate, polyurethane/polyester may also be used.

Such film substrates may be opaque to light. Such opacity provides enhanced contrast between the color faded and non-faded portions of a patterned composition on the substrate. Typically such films are white in appearance.

Optionally, one or more adhesion promoter may be included in the compositions to improve cohesion between the components of the imaging compositions and the film substrate, or work piece. Any adhesion promoter may be used as long as it does not adversely interfere with the desired color or shade change. Such adhesion promoters may be included in amounts of from 0.5 wt % to 10 wt %, or such as from 1 wt % to 5 wt % of the composition. Examples of such adhesion promoters include acrylamido hydroxyl acetic acid (hydrated and anhydrous), bisacrylamido acetic acid, 3-acrylamido-3-methyl-butanoic acid, and mixtures thereof.

The adhesive side of the article may have a removable release layer, which protects the adhesive from the environment and accidental adhesion prior to application of the article to a substrate. Removable release layers may range in thickness of from 5 μm to 50 μm or such as from 10 μm to 25 μm. Removable release layers include, but are not limited to, cellulose, polymers and copolymers such as polyesters, polyurethanes, vinyl copolymers, polyolefins, polycarbonates, polyimides, polyamides, epoxy polymers and combinations thereof.

Removable release layers may include a release coating formulation to enable ready removal of the release layer from the adhesive. Such release formulations typically include silicone-vinyl copolymers as the active release agent. Such copolymers are known in the art and conventional amounts are included in the release layer of the articles.

A protective polymer layer may be placed over the imaging composition on the film substrate. The protective polymer blocks light to prevent premature activation of the imaging composition on the substrate. The protective polymer layer may be of the same material as the film substrate.

The components, which compose the compositions, may be combined by any suitable method known in the art. Typically, the components are blended or mixed together using conventional apparatus to form a solid mixture, solution, suspension or emulsion. The formulation process is typically performed in light controlled environments to prevent premature activation of one or more of the components. The compositions may then be stored for later application or applied promptly after formulation to a substrate by anyone of the methods discussed above. Typically the compositions are stored in light controlled environments prior to use. For example, compositions with sensitizers activated by visible light are typically formulated and stored under red light.

Upon application of a sufficient amount of energy to a composition, a photofugitive or a phototropic response occurs. The amount of energy may be from 0.2 $mJ/cm^2$ and greater, or such as from 0.2 $mJ/cm^2$ to 100 $mJ/cm^2$, or such as from 2 $mJ/cm^2$ to 40 $mJ/cm^2$, or such as from 5 $mJ/cm^2$ to 30 $mJ/cm^2$.

The imaging compositions undergo color or shade changes with the application of energy at powers of 5 mW or less (i.e., greater than 0 mW), or such as less than 5 mW to 0.01 mW, or such as from 4 mW to 0.05 mW, or such as from 3 mW to 0.1 mW, or such as from 2 mW to 0.25 mW or such as from 1 mW to 0.5 mW. Typically, such powers levels are generated with light sources in the visible range. Other photosensitizers and energy sensitive components, which may be included in the imaging compositions, may elicit a color or shade change upon exposure to energy from light outside the visible range. Such photosensitizers and energy sensitive compounds are included to provide a more pronounced color or shade contrast with that of the response caused by the application of energy at powers of 5 mW or less. Typically, photosensitizers and energy sensitive compounds, which form the color or shade contrast with photosensitizers activated by energy at powers of 5 mW or less, elicit a phototropic response.

While not being bound by theory, one or more color or shade changing mechanisms are believed involved to provide a color or shade change after energy is applied. For example, when a photofugitive response is induced, the one or more sensitizers releases a free radical to activate the one or more reducing agents to reduce the one or more sensitizers to affect a change in color or shade from dark to light. When a phototropic response is induced, for example, free radicals from one or more sensitizer induces a redox reaction between one or more leuco-type compounds and one or more oxidizing agent to affect a change in color or shade from light to dark. Some formulations may have combinations of photofugitive and phototropic responses. For example, exposing a composition to artificial energy, i.e. laser light, generates a free radical from one or more sensitizer, which then activates one or more reducing agent to reduce the sensitizer to cause a photofugitive response. Exposing the same composition to ambient light causes one or more oxidizing agent to oxidize the one or more leuco-type compounds to cause the phototropic response.

The compositions may be removed from work pieces in whole or in part by peeling the unwanted portions from the work pieces or by using a suitable developer or stripper. The developers and strippers may be aqueous based or organic based. For example, conventional aqueous base solutions may be used to remove compositions with polymer binders having acidic functionality. Examples of such aqueous base solutions are alkali metal aqueous solutions such as sodium and potassium carbonate solutions. Conventional organic developers used to remove compositions from work pieces include, but are not limited to, primary amines such as benzyl, butyl, and allyl amines, secondary amines such as dimethylamine and tertiary amines such as trimethylamine and triethylamine.

The methods and imaging compositions provide a rapid and efficient means of changing the color or shade of work pieces or of placing an image on work pieces such as aeronautical ships, marine vessels and terrestrial vehicles, or for forming images on textiles. After the composition is applied a 3-D image with sufficient amount of energy is applied to the composition to change its color or shade. For example, the image may be used as a mark or indicator to drill holes for fasteners to join parts together such as in the assembly of an automobile, to form an outline for making a logo or picture on an airplane body, or to align segments of marine vessel parts. The methods and compositions also may be used to identify surface defects such as dents and scratches. Since the compositions may be promptly applied to a work pieces and the image promptly formed by application of energy to create color or shade contrast, workers no longer need to work adjacent the work pieces to mark laser beam images with hand-held ink markers or tape in the fabrication of products. Accordingly, the problems of blocking laser beams caused by workers using the hand-held markers and tape are eliminated.

The methods and compositions are suitable for industrial assembly line fabrication of numerous products. For example, a work pieces such as an airplane fuselage may pass to station 1 where the imaging composition is applied to a surface of the airplane fuselage to cover the desired portions or the entire surface. The composition may be coated on the fuselage by standard spray coating, brushing, or roller coating procedures or laminated to the surface. The coated airplane fuselage is then transferred to station 2 where a 3-D imaging system measures the distance between a projector and at least one reference sensor on the work piece; applying algorithms to position the 3-D image on the composition coating the work piece; and applying the 3-D image on the composition with sufficient energy to form an image. While the first airplane fuselage is at station 2, a second fuselage may be moved into station 1 for coating. The energy may be applied using laser beams, which induce a color or shade change on the surface of the airplane fuselage. Since manual marking by workers is eliminated, the imaged airplane fuselage is then promptly transferred to station 3 for further processing such as developing away or stripping unwanted portions of the coating, or drilling holes in the fuselage for fasteners for the alignment of parts at other stations. Further, the elimination of workers at the imaging station improves the accuracy of image formation since there are no workers to interfere with the laser beams pathway to their designated points on the coated airplane fuselage. Accordingly, the imaging compositions provide for more efficient manufacturing than many conventional imaging and alignment processes.

In addition to the use of the imaging compositions in alignment processes, the compositions may be used to prepare proofing products, photoresists, soldermasks, printing plates, and other photopolymer products.

The imaging compositions also may be used in paints such as water based and organic based paints. When the compositions are used in paints, they may be included in amounts of from 1 wt % to 25 wt %, or such as from 5 wt % to 20 wt %, or such as from 8 wt % to 15 wt % of the final mixture.

Example 1

Photofugitive and Phototropic Responses

The respective components for the two different formulations disclosed in Tables 1 and 2 below were mixed together at 20° C. under red light to form two homogeneous mixtures. The formulations were prepared to illustrate the difference between a photofugitive response and a phototropic response when exposed to visible light at 532 nm.

TABLE 1

| Component | Percent Weight |
|---|---|
| Copolymer of n-hexyl methacrylate, methymethacrylate, n-butyl acrylate, styrene and methacrylic acid | 55 |
| Dipropylene glycol dibenzoate | 16 |
| Hexaarylbiimidazole | 2 |
| 9,10-Phenanthrenequinone | 0.2 |
| Triethanolamine triacetate | 1.5 |
| Leuco Crystal Violet | 0.3 |
| Cyclopentanone, 2,5-bis[[4-(diethylamino)phenyl]methylene]-,(2E,5E) | 0.1 |
| Methyl ethyl ketone | Sufficient amount to bring formulation to 100% by weight. |

The copolymer was formed from monomers of 29 wt % n-hexyl methacrylate, 29 wt % methylmethacrylate, 15 wt % n-butyl acrylate, 5 wt % styrene, and 22 wt % methacrylic acid. A sufficient amount of methyl ethyl ketone was used to form a 45 wt % solids mixture. The copolymer was formed by conventional free-radical polymerization.

After the homogenous mixture was prepared, it was spray coated on a polyethylene film. The polyethylene film was 30 cm×30 cm and had a thickness of 250 microns. The homogeneous mixture was dried using a hair dryer to removal the methyl ethyl ketone.

Figure 3:
FIG. 3 is a photograph of a photofugitive response by a composition dried on a polymer film after selective application of a laser beam.

Under UV light the dried coating on the polyethylene film was reddish brown in color as shown in FIG. 3. When the coating was selectively exposed to light at 532 nm from a hand held laser, a photofugitive response was elicited. The exposed portions faded to a light gray as shown by the four rectangular patterns in FIG. 3.

TABLE 2

| Components | Weight Percent |
|---|---|
| Copolymer of n-hexyl methacrylate, methylmethacrylate, n-butyl acrylate, styrene, and methacrylic acid | 64 |
| Dipropylene glycol dibenzoate | 19 |
| Difluorinated titanocene | 3 |
| Leuco Crystal Violet | 1 |
| Methyl ethyl ketone | A sufficient amount was added to bring the formulation to 100% by weight. |

Figure 4:
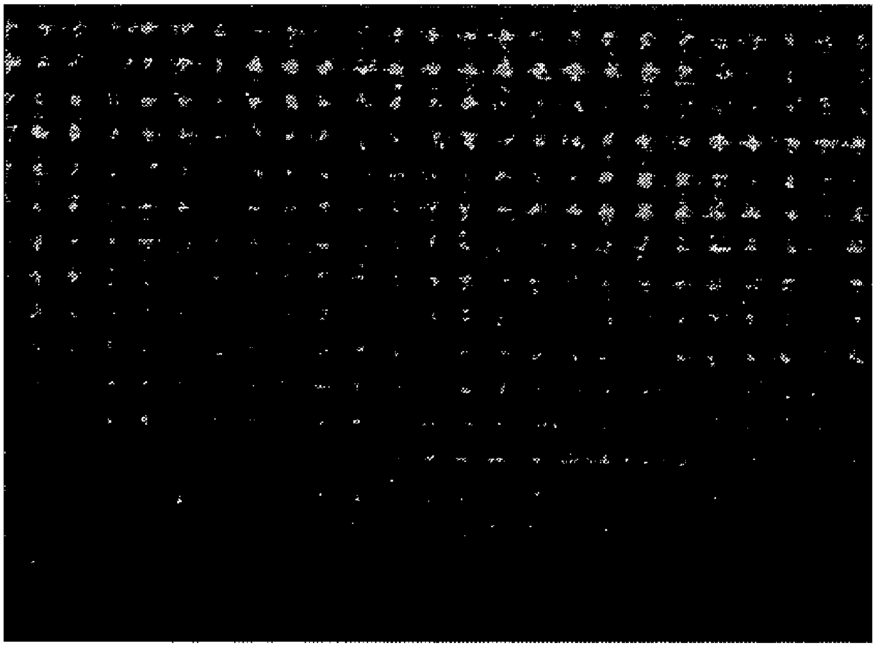
FIG. 4 is a photograph of a phototropic response by a composition dried on a polymer film after selective application of a laser beam.

The same copolymer was used as the formulation of Table 1. After the mixture was prepared, it was spray coated on a polyethylene film under UV light. The polyethylene film was 30 cm×30 cm and had a thickness of 250 microns. The coating on the polyethylene film was dried using a hair dryer. The coating had a yellow green appearance under UV light as shown in FIG. 4.

Energy from a hand held laser at a wavelength of 532 nm was selectively applied to the coating to induce a phototropic response. The pattern of four rectangles formed with the laser darkened to form four violet rectangles as shown in FIG. 4.

Example 2

Photosensitive Article

The following composition with the components in the table below is prepared.

TABLE 3

| Component | Weight Percent |
|---|---|
| Copolymer of n-hexyl methacrylate, methylmethacrylate, n-butyl acrylate, styrene and methacrylic acid | 86 |
| Conjugated Cyclopentanone | 1 |
| 1,6-Pyrenequinone | 0.5 |
| 1,8-Pyrenequinone | 0.5 |
| Hexaarylbiimidazole | 3 |
| Leuco Crystal Violet | 2 |
| Fluoronated Onium Salt | 3 |
| Secondary Amine | 2 |

TABLE 3-continued

| Component | Weight Percent |
|---|---|
| Triethanolamine Triacetate | 2 |
| Methyl Ethyl Ketone | Sufficient amount is added to the formulation to form a 70 wt % solids composition |

The copolymer is the same copolymer as in Example 1. The formulation is prepared under red light at 20° C. The components are mixed together using a conventional mixing apparatus to form a homogeneous mixture.

The homogeneous mixture is roller coated on one side of a polyethylene terephthalate film having the dimensions 40 cm×40 cm and a thickness of 2 mm. The opposite side is coated with a pressure sensitive releasable adhesive with a releasable protective backing of cellulose acetate. The protective backing has a layer of a silicone vinyl copolymer release agent for easy removal of the protective backing from the adhesive. The pressure sensitive releasable adhesive is a conventional polyurethane adhesive.

The coating is dried to the polyethylene terephthalate film with a hair dryer. The releasable cellulose acetate backing is removed and the polyethylene terephthalate film with the coating is hand pressed to an aluminum coupon with the dimensions 60 cm×60 cm. Under UV light the coating appears amber in color.

A light beam at a wavelength of 532 nm from a 3-D image system is selectively applied to the amber coating to form patterns of 5 equidistant dots. Selective applications of the light beam causes fading of the amber color to form 5 clear dots. A conventional drill for drilling holes in aluminum is used to drill holes through the aluminum at the positions of the dots. The polyethylene terephthalate adhesive is hand peeled from the aluminum coupon leaving the aluminum coupon with three equidistant holes.

Example 3

Photosensitive Composition in Paint Formulation

The following paint formulation is prepared.

TABLE 4

| Components | Weight Percent |
|---|---|
| Tamol ™ 731 (25%)dispersant | 1 |
| Propylene Glycol | 2 |
| Patcote ™ 801 (defoamer) | 1 |
| Titanium dioxide-Pure R-900 | 23 |
| Optiwhite ™ (China Clay) | 9 |
| Attagel ™ 50 (Attapulgite Clay) | 1 |
| Acrylic Polymer Binder | 32 |
| Texanol ™ | 1 |
| Thickener water mixture | 21 |
| Water | Sufficient amount to bring the formulation to 100 wt % |

The paint formulation in Table 4 is blended with the photosensitive composition disclosed in Table 3, Example 2 such that the photosensitive composition composes 5 wt % of the final formulation. The paint and the photosensitive composition are mixed together at 20° C. using conventional mixing apparatus to form a homogeneous blend. The mixing is done under red light.

The paint/photosensitive composition blend is roller coated on an aluminum coupon of 80 cm×80 cm. Good adhesion is expected between the blend and the aluminum coupon.

Selective application of light at 532 nm from a 3-D imaging system causes the selected portions of the coating to go from amber to clear.

Example 4

Imaging Composition and Method

An imaging composition is prepared with the components shown in table 5 below.

TABLE 5

| Imaging Composition | |
|---|---|
| Components | Weight Percent |
| Copolymer of n-hexyl methacrylate, methylmethacrylate, n-butyl acrylate, styrene and methacrylic acid | 78 |
| Dipropylene Glycol Dibenzoate | 12 |
| Hexaarylbiimidazole | 2 |
| 9,10-Phenanthrenequinone | 0.2 |
| Triethanolamine Triacetate | 1.5 |
| Leuco Crystal Violet | 0.3 |
| Conjugated Cyclopentanone | 0.1 |
| O-Phthalic Acid | 0.4 |
| Fluoronated Onium salt | 1 |
| Secondary Amine | 2 |
| Flow Agent | 0.5 |
| Polyurethane releasable adhesive | 2 |
| Acetone | Sufficient amount of acetone is added to the formulation to provide a 55 wt % solids composition |

The components of Table 5 are mixed together at room temperature under red light to form a homogeneous mixture. The mixture is placed in storage container of a robotic spray system for coating aircraft.

The robotic spray system sprays the imaging composition on one side of the tail of an airplane fuselage in amounts just enough to coat the surface of the tail. Application is done at room temperature under UV light. Upon exposure of the imaging composition to the UV light in the application room, the imaging composition turns an amber color. The polyurethane adhesive in the imaging composition permits the composition to firmly adhere to the tail of the fuselage and curtail the composition from running. The releasable adhesive also permits ready removal of any unwanted portion of the coating without the need for developers or strippers.

Warm air from a fan removes much of the acetone from the formulation drying the composition on the tail. The temperature of the warm air is around 28° C. to 30° C. When the imaging composition is dry, the tail of the fuselage is imaged.

Imaging is done using a 3-D imaging system. A single reference sensor placed on the tail enables the range-finding system of the 3-D imaging system to accurately project a 3-D laser image on the coated tail representing a logo. Algorithms of a coordinate system transform are used to project the 3-D laser image onto the tail. The laser beams have wavelengths of 532 nm.

The portion of the tail exposed to the laser beams fades to create a contrast between the laser exposed and non-laser exposed portions of the coating. A seam is formed between the faded portion and non-faded portion of the coating. The seam is formed during laser application by a laser beam. The seam permits ready removal of the faded portion by peeling the faded portion from the tail exposing the bare metal of the fuselage. The exposed portion of the fuselage is then spray painted to form the log. The remainder of the coating is then peeled from the tail. The process is repeated with a new fuselage.

The combination of the 3-D imaging system and imaging composition improves the efficiency and accuracy of marking a work piece. Workers no longer have to hand mark the points where the laser beams contact the work piece, thus interference by workers between the work piece and the points where the laser beams contact the work piece is eliminated. Accordingly, the accuracy of marking is improved.

What is claimed is:

1. A method comprising:

a) applying an imaging composition comprising one or more sensitizers to a work piece; and b) projecting a 3-D image onto the imaging composition at 5 mW or less to affect a color or shade change in the imaging composition to form an image.

2. The method of claim 1, wherein the 3-D image is selectively projected on the imaging composition.

3. The method of claim 1, wherein the imaging composition further comprises one or more quinone compounds.

4. The method of claim 1, wherein the one or more sensitizers are visible light sensitizers, UV light sensitizers or combinations thereof.

5. The method of claim 4, wherein the visible light sensitizer is a fluorescein type dye.

6. The method of claim 1, wherein the imaging composition further comprises a color former.

7. The method of claim 1, wherein the image is a logo, number, letter, marks for alignment of the work piece or marks to indicate defects on the work piece.

8. The method of claim 1, further comprising the step of peeling the imaging composition from the work piece.

9. The method of claim 1, wherein the work piece is an aeronautical ship, marine vessel or terrestrial vehicle.

* * * * *